United States Patent
Cho et al.

(10) Patent No.: US 12,302,653 B2
(45) Date of Patent: May 13, 2025

(54) IMAGE SENSOR USING TRANSFER GATE SIGNAL HAVING THREE VOLTAGE LEVELS, AND METHOD OF OPERATING THE SAME

(71) Applicant: SAMSUNG ELECTRONICS CO., LTD., Suwon-si (KR)

(72) Inventors: Jeongjin Cho, Yongin-si (KR); Kyungho Lee, Suwon-si (KR); Taesub Jung, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 496 days.

(21) Appl. No.: 17/715,358

(22) Filed: Apr. 7, 2022

(65) Prior Publication Data

US 2023/0011827 A1 Jan. 12, 2023

(30) Foreign Application Priority Data

Jul. 6, 2021 (KR) .................. 10-2021-0088600

(51) Int. Cl.
*H01L 27/146* (2006.01)
*H10F 39/00* (2025.01)
*H10F 39/18* (2025.01)

(52) U.S. Cl.
CPC ......... *H10F 39/8037* (2025.01); *H10F 39/18* (2025.01); *H10F 39/811* (2025.01)

(58) Field of Classification Search
CPC .... H10F 39/8037; H10F 39/18; H10F 39/811; H01L 27/14612; H01L 27/14636; H01L 27/14643; H04N 25/59; H04N 25/745; H04N 25/766
See application file for complete search history.

(56) References Cited

U.S. PATENT DOCUMENTS

| | | | |
|---|---|---|---|
| 7,829,832 B2 | 11/2010 | Mauritzson et al. | |
| 9,426,395 B2 | 8/2016 | Jakobson et al. | |
| 10,728,482 B2 | 7/2020 | Yun et al. | |
| 2004/0223065 A1* | 11/2004 | Takayanagi | H04N 25/575 348/E3.021 |
| 2020/0304742 A1 | 9/2020 | Yun et al. | |

FOREIGN PATENT DOCUMENTS

| | | |
|---|---|---|
| JP | 5068223 B2 | 11/2012 |
| JP | 2018-121142 A | 8/2018 |
| KR | 10-1241674 B1 | 3/2013 |
| KR | 10-2018-0077969 A | 7/2018 |
| KR | 10-2176000 B1 | 11/2020 |

* cited by examiner

*Primary Examiner* — Tony Ko
(74) *Attorney, Agent, or Firm* — Sughrue Mion, PLLC

(57) ABSTRACT

A method of operating an image sensor includes accumulating first charges through a photo diode, applying a first transfer gate signal having a first voltage level to a transfer transistor, performing, through a reset transistor, a first reset operation on a floating diffusion node connected with the reset transistor and the transfer transistor, changing the first voltage level of the first transfer gate signal to a second voltage level higher than the first voltage level, during the first reset operation, changing the second voltage level of the first transfer gate signal to a third voltage level higher than the second voltage level, and changing the third voltage level of the first transfer gate signal to the second voltage level.

16 Claims, 17 Drawing Sheets

IMAGE SENSOR USING TRANSFER GATE SIGNAL HAVING THREE VOLTAGE LEVELS, AND METHOD OF OPERATING THE SAME

CROSS-REFERENCE TO RELATED APPLICATIONS

This application claims priority under 35 U.S.C. § 119 to Korean Patent Application No. 10-2021-0088600 filed on Jul. 6, 2021, in the Korean Intellectual Property Office, the disclosure of which being incorporated by reference herein in its entirety.

BACKGROUND

Embodiments of the present disclosure described herein relate to an image sensor, and more particularly, relate to an image sensor using a transfer gate signal having three voltage levels, and a method of operating the same.

An image sensor detects a light reflected from an external object and generates an electrical signal including image data. In general, the image sensor includes a plurality of pixels. Each of the pixels includes a photo diode and a floating diffusion node. A transfer gate signal controls the transfer of accumulated charges from the photo diode to the floating diffusion node.

Nowadays, the pixels of the image sensor are being miniaturized to increase the resolution of image data. As a size of a pixel becomes smaller, a capacitance thereof may become smaller. In this case, the pixel may sensitively react to an unintended change in the amount of charges. The quality of image data may be degraded by the change in the amount of charges. Charges may be unintendedly charged to or discharged from the floating diffusion node of the pixel, due to external noise, a temperature change, a leakage current, a white spot generated by a defect coming from a process, a dark current, and the like. In the case where charges are charged to or discharged from the floating diffusion node regardless of the control of the transfer gate signal, the quality of image data may be degraded.

SUMMARY

It is an aspect to provide an image sensor using a transfer gate signal having three voltage levels, and a method of operating the same.

According to an aspect of one or more embodiments, there is provided a method of operating an image sensor which includes a pixel including a photo diode, a transfer transistor, and a reset transistor, and a row driver controlling the pixel. The method includes accumulating first charges, through the photo diode, applying a first transfer gate signal having a first voltage level to the transfer transistor, performing, through the reset transistor, a first reset operation on a floating diffusion node connected with the reset transistor and the transfer transistor, changing the first voltage level of the first transfer gate signal to a second voltage level higher than the first voltage level, during the first reset operation, changing the second voltage level of the first transfer gate signal to a third voltage level higher than the second voltage level such that the first charges accumulated through the photo diode are diffused to the floating diffusion node through the transfer transistor, and changing the third voltage level of the first transfer gate signal to the second voltage level.

According to another aspect of one or more embodiments, there is provided a method of operating an image sensor which includes a pixel including a photo diode, a transfer transistor, and a reset transistor, and a row driver controlling the pixel. The method includes accumulating first charges, through the photo diode, applying a first transfer gate signal having a first voltage level to the transfer transistor, performing, through the reset transistor, a first reset operation on a floating diffusion node connected with the reset transistor and the transfer transistor, changing the first voltage level of the first transfer gate signal to a second voltage level higher than the first voltage level after performing the first reset operation, changing the second voltage level of the first transfer gate signal to a third voltage level higher than the second voltage level such that the first charges accumulated through the photo diode are diffused to the floating diffusion node through the transfer transistor, and changing the third voltage level of the first transfer gate signal to the second voltage level.

According to yet another aspect of one or more embodiments, there is provided an image sensor comprising a pixel array that includes a plurality of pixels, and a row driver that generates a reset gate signal, and a first transfer gate signal having one of a first voltage level, a second voltage level higher than the first voltage level, and a third voltage level higher than the second voltage level. A first pixel of the plurality of pixels includes a first photo diode that senses a light and to accumulate charges, a first transfer transistor that is connected between the first photo diode and a floating diffusion node and operates based on the first transfer gate signal, and a reset transistor that is connected between a power node and the floating diffusion node and operates based on the reset gate signal. The row driver applies the first transfer gate signal having the first voltage level to the first transfer transistor, while the first photo diode accumulates the charges, changes the first voltage level of the first transfer gate signal to the second voltage level, after the first photo diode accumulates the charges, and changes the second voltage level of the first transfer gate signal to the third voltage level such that the accumulated charges of the first photo diode are diffused to the floating diffusion node.

BRIEF DESCRIPTION OF THE FIGURES

The above and other aspects will become apparent by describing in detail embodiments thereof with reference to the accompanying drawings, in which.

DETAILED DESCRIPTION

Below, various embodiments will be described in detail and clearly to such an extent that one skilled in the art easily carries out the present disclosure.

Components described in the detailed description with reference to terms "part", "unit", "module", "layer", etc. and function blocks illustrated in drawings may be implemented in the form of software, hardware, or a combination thereof. For example, the software may be a machine code, firmware, an embedded code, and application software. For example, the hardware may include an electrical circuit, an electronic circuit, a processor, a computer, an integrated circuit, integrated circuit cores, a pressure sensor, an inertial sensor, a microelectromechanical system (MEMS), a passive element, or a combination thereof.

Figure 1:
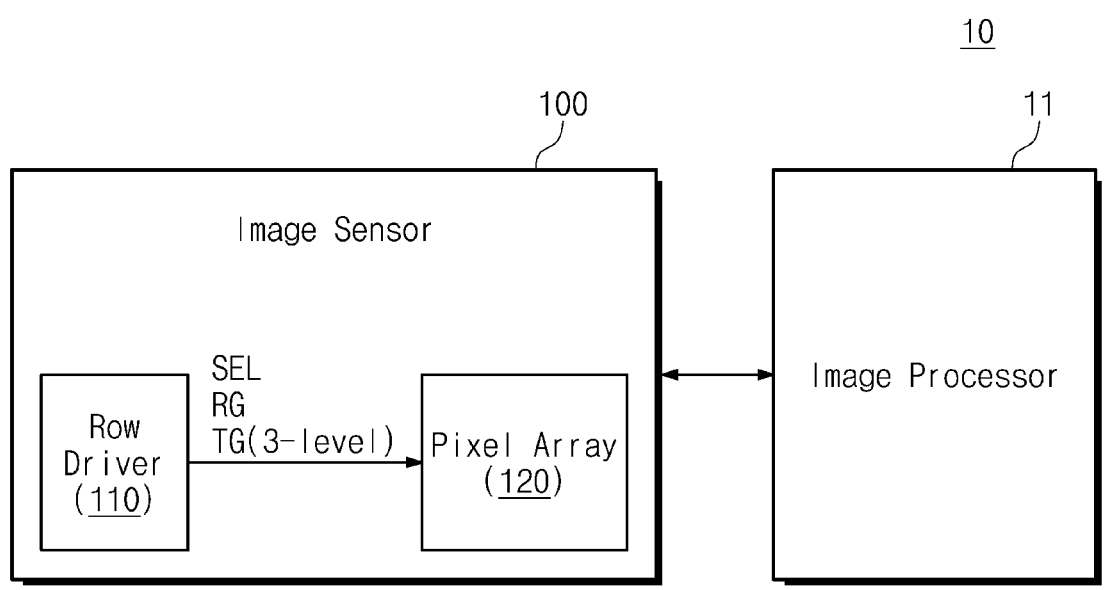
FIG. 1 is a block diagram of an electronic device, according to an embodiment.

FIG. 1 is a block diagram of an electronic device, according to an embodiment. An electronic device 10 is illustrated in FIG. 1. The electronic device 10 may refer to a device that detects a light reflected from an external object and processes image data based on the detected light. For example, the electronic device 10 may be implemented with one of various types of electronic devices such as a smartphone, a tablet personal computer (PC), a laptop PC, and a wearable device.

The electronic device 10 may include an image sensor 100 and an image processor 11. The image sensor 100 may operate under control of the image processor 11. For example, the image sensor 100 may detect a light reflected from the external object, may convert the detected light into an electrical signal, and may provide the electrical signal to the image processor 11 as image data. The image processor 11 may receive image data from the image sensor 100 and may process the image data.

The image sensor 100 may include a row driver 110 and a pixel array 120. The row driver 110 may generate a select signal SEL, a reset gate signal RG, and a transfer gate signal TG. The select signal SEL may refer to a signal for selecting some of pixels of the pixel array 120. The reset gate signal RG may refer to a signal for controlling a reset transistor in a pixel of the pixel array 120. The transfer gate signal TG may refer to a signal for controlling a transfer transistor in the pixel of the pixel array 120. The pixel of the pixel array 120 that is controlled by the row driver 110 will be described with reference to FIG. 4.

According to some embodiments, the row driver 110 may generate the transfer gate signal TG having three voltage levels. For example, the transfer gate signal TG may have a first voltage level, a second voltage level, or a third voltage level. In other words, the transfer gate signal TG may have the first voltage level, the second voltage level, and the third voltage level at different timings. The second voltage level may be higher than the first voltage level. The third voltage level may be higher than the second voltage level.

The transfer gate signal TG of the first voltage level may suppress a negative effect due to a defect (e.g., a defect of an insulating layer) while a pixel detects a light and accumulates charges. The transfer gate signal TG of the second voltage level may suppress a negative effect due to a leakage (e.g., an unintended leakage current) during a readout period. The transfer gate signal TG of the third voltage level may form a channel between a photo diode and a floating diffusion node. The transfer gate signal TG will be described in more detail with reference to FIGS. 7, 8, 9, 10A, and 10B.

The pixel array 120 may include a plurality of pixels. For example, the pixel array 120 may include the plurality of pixels arranged in a row direction and a column direction. The pixel array 120 may operate based on the select signal SEL, the reset gate signal RG, and the transfer gate signal TG from the row driver 110. The pixel array 120 may output image data to the image processor 11.

The image processor 11 may communicate with the image sensor 100. The image processor 11 may control an operation of the image sensor 100. For example, the image processor 11 may allow the row driver 110 to generate the select signal SEL, the reset gate signal RG, and the transfer gate signal TG. In some embodiments, the image processor 11 may control the row driver 110 to generate the select signal SEL, the reset gate signal RG, and the transfer gate signal TG. The image processor 11 may receive the image data generated by the pixel array 120. The image processor 11 may correct the image data (e.g., may correct image data of a defective pixel based on image data of an adjacent pixel), and the image processor 11 may store the image data in a storage device or may output the image data to a display device.

In some embodiments, the image processor 11 may control the row driver 110 to adjust a waveform of the transfer gate signal TG. For example, the image processor 11 may control a time at which the transfer gate signal TG changes from the first voltage level to the second voltage level or a time at which the transfer gate signal TG changes from the second voltage level to the first voltage level. For example, the image processor 11 may adjust the second voltage level of the transfer gate signal TG (i.e., may increase or decrease the second voltage level thereof). For example, the image processor 11 may adjust a length of a time period during which the transfer gate signal TG is maintained at the third voltage level.

Figure 2:
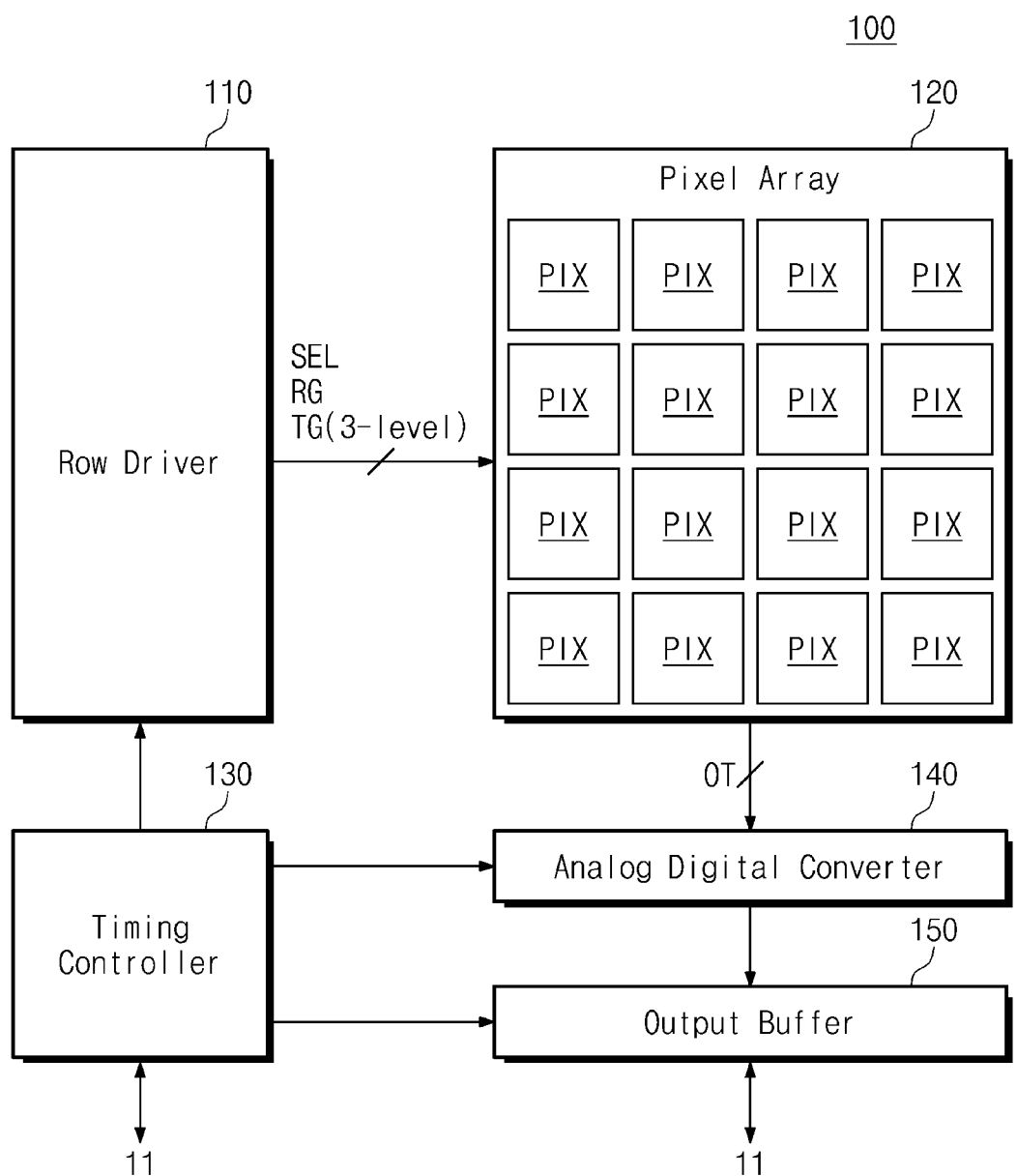
FIG. 2 is a block diagram illustrating an image sensor of the electronic device of FIG. 1 in detail, according to an embodiment.

FIG. 2 is a block diagram illustrating an image sensor of FIG. 1 in detail, according to an embodiment. Referring to FIGS. 1 and 2, the image sensor 100 may include the row driver 110, the pixel array 120, a timing controller 130, an analog-to-digital converter 140, and an output buffer 150.

The row driver 110 may output the select signal SEL, the reset gate signal RG, and the transfer gate signal TG to the pixel array 120. The select signal SEL may select pixels PIX belonging to a corresponding row from among the pixels PIX of the pixel array 120. The reset gate signal RG and the transfer gate signal TG may control a reset transistor and a transfer transistor of a corresponding pixel PIX.

The pixel array 120 may include a plurality of the pixels PIX. The pixels PIX may be arranged in the row direction and the column direction. For better understanding of the present disclosure, the pixel array 120 is illustrated in FIG.

2 as including four pixels PIX in the row direction and four pixels PIX in the column direction, but embodiments are not limited thereto. For example, in some embodiments, the number of pixels in the row and column directions may vary and may be more than four, and in some embodiments, the number of pixels PIX included in the pixel array 120 may increase or decrease in the row direction and the column direction.

Each of the plurality of pixels PIX of the pixel array 120 may operate based on the select signal SEL, the reset gate signal RG, and the transfer gate signal TG that are received from the row driver 110. Each of the plurality of pixels PIX may detect a light reflected from the external object and output an output signal OT being an electrical signal including image data to the analog-to-digital converter 140.

The timing controller 130 may communicate with the image processor 11. The timing controller 130 may control the row driver 110, the analog-to-digital converter 140, and the output buffer 150 under control of the image processor 11. The timing controller 130 may generate a clock signal and may control input timings and output timings of the row driver 110, the analog-to-digital converter 140, and the output buffer 150. In some embodiments, under control of the image processor 11, the timing controller 130 may control an operation in which the row driver 110 generates the select signal SEL, the reset gate signal RG, and the transfer gate signal TG.

The analog-to-digital converter 140 may receive the output signal OT from the pixel array 120. The analog-to-digital converter 140 may perform an analog-to-digital conversion operation based on the output signal OT. The analog-to-digital converter 140 may output the converted output signal to the output buffer 150. For example, the output signal OT generated by the pixel array 120 may be an analog signal, and the analog-to-digital converter 140 may convert the output signal OT into a digital signal, and may output the converted digital signal to the output buffer 150.

The output buffer 150 may receive the converted output signal from the analog-to-digital converter 140. The output buffer 150 may store the converted output signal. The output buffer 150 may output the stored output signal to the image processor 11, under control of the timing controller 130.

Figure 3:
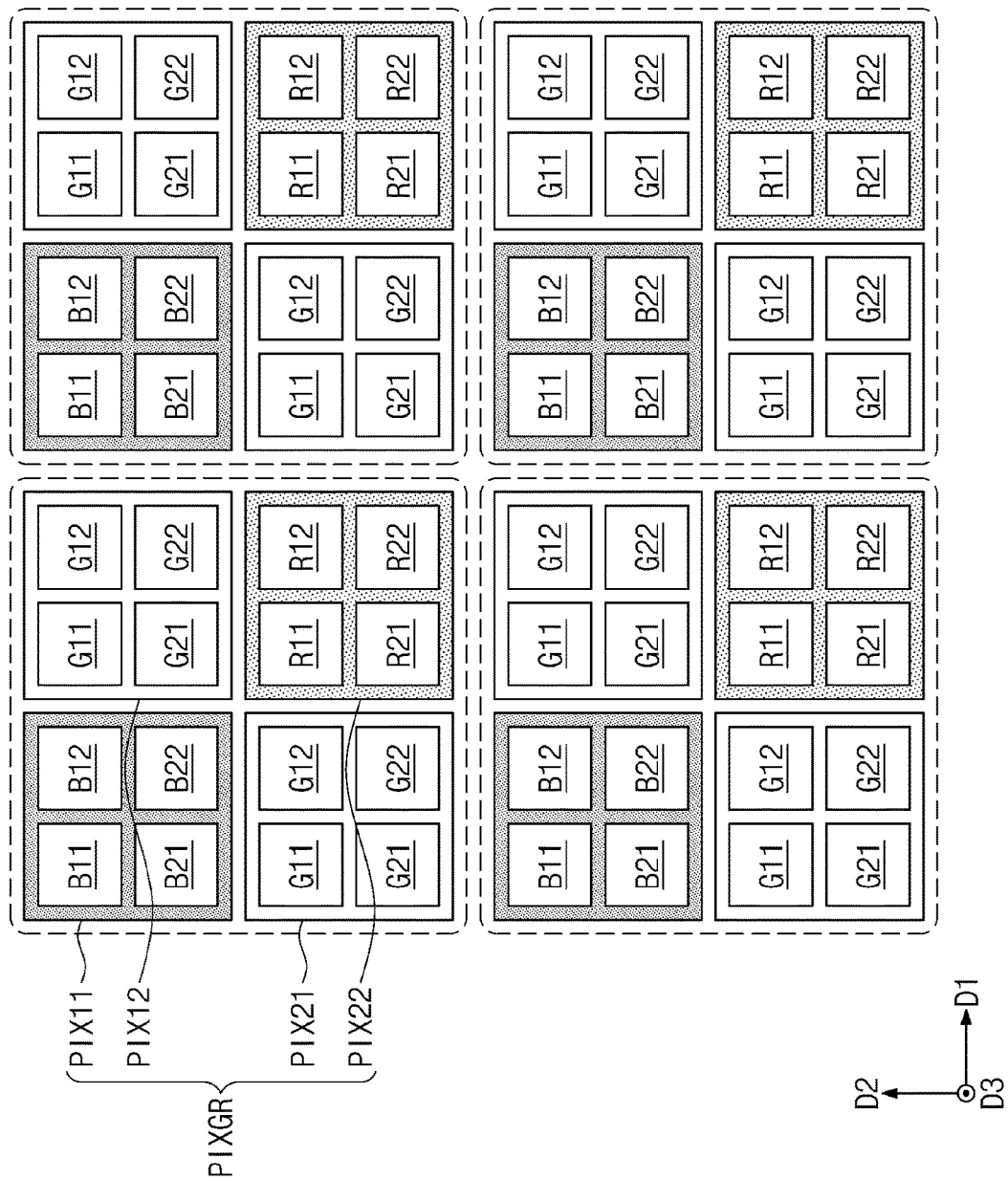
FIG. 3 is a diagram illustrating a pixel array of the image sensor of FIG. 2 in detail, according to some embodiments.

FIG. 3 is a diagram illustrating a pixel array of FIG. 2 in detail, according to some embodiments. Referring to FIGS. 2 and 3, the pixel array 120 may include a plurality of pixel groups PIXGR.

Below, for convenience of description, a first direction D1, a second direction D2, and a third direction D3 will be mentioned. The first direction D1 may refer to a direction in which pixels are arranged. The second direction D2 may refer to a direction that is perpendicular to the first direction D1. The third direction D3 may refer to a direction that is perpendicular to a plane defined by the first and second directions D1 and D2. For example, the first direction D1 and the second direction D2 may correspond to the row direction and the column direction of the pixel array 120, respectively. The third direction D3 may refer to a direction that is perpendicular to a semiconductor substrate in which the pixels PIX of the pixel array 120 are formed.

The plurality of pixel groups PIXGR of the pixel array 120 may be arranged in the first direction D1 and the second direction D2. Each of the plurality of pixel groups PIXGR may include four pixels PIX11, PIX12, PIX21, and PIX22. The pixels PIX11, PIX12, PIX21, and PIX22 may be arranged in the first direction D1 and the second direction D2.

For example, in each pixel group PIXGR, the pixel PIX12 may be adjacent to the pixel PIX11 in the first direction D1. The pixel PIX21 may be adjacent to the pixel PIX11 in a direction opposite to the second direction D2. The pixel PIX22 may be adjacent to the pixel PIX21 in the first direction D1.

According to some embodiments, color filters may be disposed on/over the pixels PIX11, PIX12, PIX21, and PIX22 of the pixel group PIXGR. For example, as illustrated in FIG. 3, a blue color filter may be disposed on the pixel PIX11. A green color filter may be disposed on the pixel PIX12. A green color filter may be disposed on the pixel PIX21. A red color filter may be disposed on the pixel PIX22. As such, the pixel PIX11 may generate an electrical signal corresponding to the amount of blue light, the pixels PIX12 and PIX21 may generate electrical signals corresponding to the amount of green light, and the pixel PIX22 may generate an electrical signal corresponding to the amount of red light.

According to some embodiments, each of the pixels PIX11, PIX12, PIX21, and PIX22 of the pixel group PIXGR may include a plurality of sub-pixels having the same color type. For example, the pixel PIX11 may include four sub-pixels B11, B12, B21, and B22 arranged in the first direction D1 and the second direction D2. A color type of the sub-pixels B11, B12, B21, and B22 may be blue. As in the above description, each of the pixels PIX12 and PIX21 may include sub-pixels G11, G12, G21, and G22 whose color type is green, and the pixel PIX22 may include sub-pixels R11, R12, R21, and R22 whose color type is red.

In some embodiments, sub-pixels included in one pixel may be implemented in a four-shared structure in which the remaining circuits other than a photo diode and a transfer transistor are shared. This will be described in more detail with reference to FIGS. 11 and 12.

Figure 4:
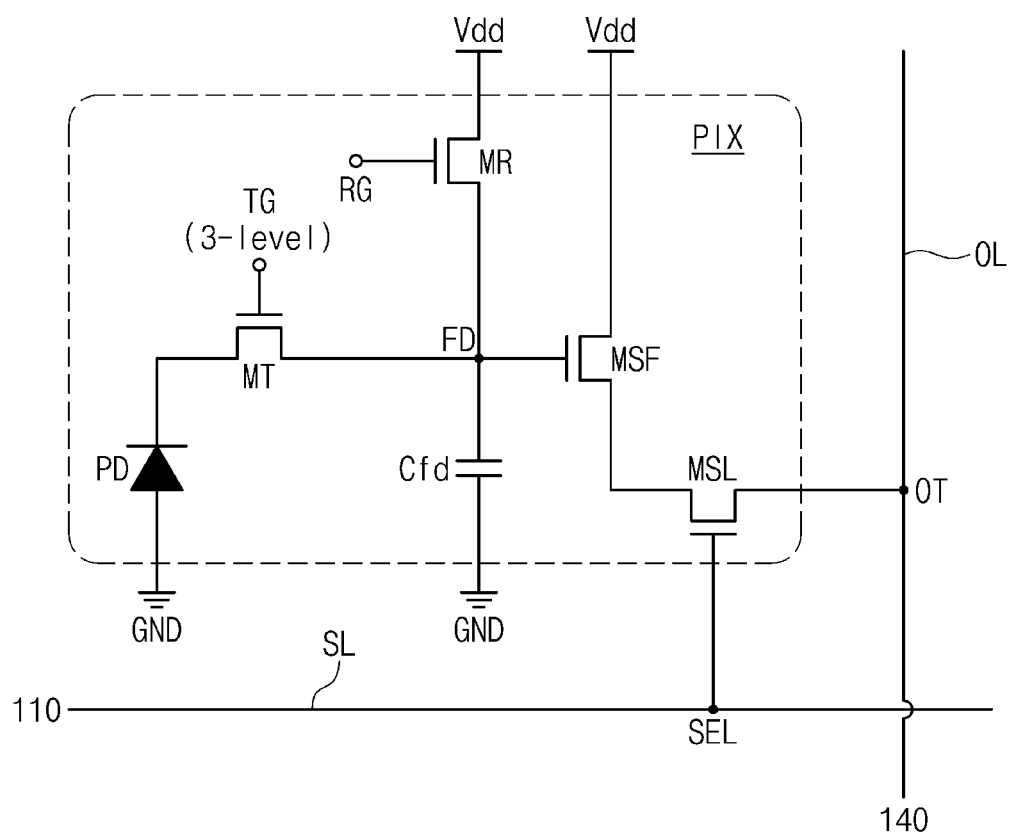
FIG. 4 is a circuit diagram illustrating a pixel of the image sensor of FIG. 2 in detail, according to some embodiments.

FIG. 4 is a circuit diagram illustrating a pixel of FIG. 2 in detail, according to some embodiments. Referring to FIGS. 2 and 4, the pixel PIX may be connected with the row driver 110 and the analog-to-digital converter 140. The pixel PIX may receive the select signal SEL, the reset gate signal RG, and the transfer gate signal TG. The pixel PIX may operate based on a power supply voltage Vdd and a ground voltage GND. The pixel PIX may detect a light and may generate the output signal OT including image data.

For example, the pixel PIX may receive the select signal SEL from the row driver 110 through a selection line SL. As in the above description, the pixel PIX may receive the transfer gate signal TG from the row driver 110 through a transmission line (not illustrated), and may receive the reset gate signal RG from the row driver 110 through a reset line (not illustrated). Also, the pixel PIX may output the output signal OT to the analog-to-digital converter 140 through an output line OL.

The pixel PIX may include a photo diode PD, a transfer transistor MT, a capacitor Cfd, a reset transistor MR, a source follower transistor MSF, and a select transistor MSL.

The photo diode PD may detect a light reflected from an external object and may accumulate charges. The photo diode PD may provide the accumulated charges to a floating diffusion node FD through the transfer transistor MT. For example, during an integration period, the photo diode PD may detect a light to accumulate charges. During a readout period, the photo diode PD may provide the accumulated charges to the floating diffusion node FD through the transfer transistor MT.

The transfer transistor MT may be connected between an output terminal of the photo diode PD and the floating diffusion node FD. The transfer transistor MT may operate based on the transfer gate signal TG.

According to some embodiments, the transfer gate signal TG may have the first voltage level, the second voltage level, or the third voltage level. The first voltage level may be lower than the ground voltage GND. The second voltage level may be higher than the first voltage level. The third voltage level may be higher than the second voltage level. The third voltage level may be higher than a threshold voltage of the transfer transistor MT.

While the transfer gate signal TG is maintained at the first voltage level, the transfer transistor MT may accumulate charges by detecting a light during the integration period. In this case, the transfer transistor MT may be biased with a voltage level lower than the ground voltage GND, and thus, a negative effect due to a defect of an insulating layer may be suppressed.

In response to the transfer gate signal TG of the second voltage level, the transfer transistor MT may disconnect the photo diode PD from the floating diffusion node FD during a portion of the readout period. In this case, the transfer transistor MT may be biased with the second voltage level higher than the first voltage level, and thus, a negative effect due to an unintended leakage may be suppressed.

In response to the transfer gate signal TG of the third voltage level, the transfer transistor MT may form a channel between the photo diode PD and the floating diffusion node FD during a portion of the readout period. For example, charges accumulated at the photo diode PD during the integration period may be diffused to the floating diffusion node FD while the transfer gate signal TG of the third voltage level is applied to the transfer transistor MT.

The negative effects of the transfer transistor MT will be described in more detail with reference to FIG. 5.

The capacitor Cfd may be connected between the floating diffusion node FD and a ground node having the ground voltage GND. The capacitor Cfd may store charges received from the photo diode PD and may determine a voltage level of the floating diffusion node FD.

The reset transistor MR may be connected between a power node having the power supply voltage Vdd and the floating diffusion node FD. The reset transistor MR may reset the floating diffusion node FD based on the reset gate signal RG.

For example, when the reset gate signal RG of a low voltage level is applied to the reset transistor MR, the reset transistor MR may be turned off. When the reset transistor MR is turned off, the floating diffusion node FD may be floated. When the reset gate signal RG of a high voltage level is applied to the reset transistor MR, the reset transistor MR may connect the power node and the floating diffusion node FD such that a voltage level of the floating diffusion node FD is reset.

The source follower transistor MSF may be connected between the power node having the power supply voltage Vdd and the select transistor MSL. The source follower transistor MSF may operate in response to a voltage level of the floating diffusion node FD. For example, when the voltage level of the floating diffusion node FD exceeds a threshold voltage level of the source follower transistor MSF, the source follower transistor MSF may connect the power node and the select transistor MSL.

The select transistor MSL may be connected between the source follower transistor MSF and the output line OL. A gate of the select transistor MSL may be connected with the selection line SL. In response to the select signal SEL received through the selection line SL, the select transistor MSL may provide an electrical signal received from the source follower transistor MSF to the output line OL as the output signal OT.

For example, when the select signal SEL of a low voltage level is applied to the select transistor MSL, the select transistor MSL may disconnect the source follower transistor MSF from the output line OL. When the select signal SEL of a high voltage level is applied to the select transistor MSL, the select transistor MSL may connect the source follower transistor MSF and the output line OL such that the output signal OT is output through the output line OL.

Figure 5:
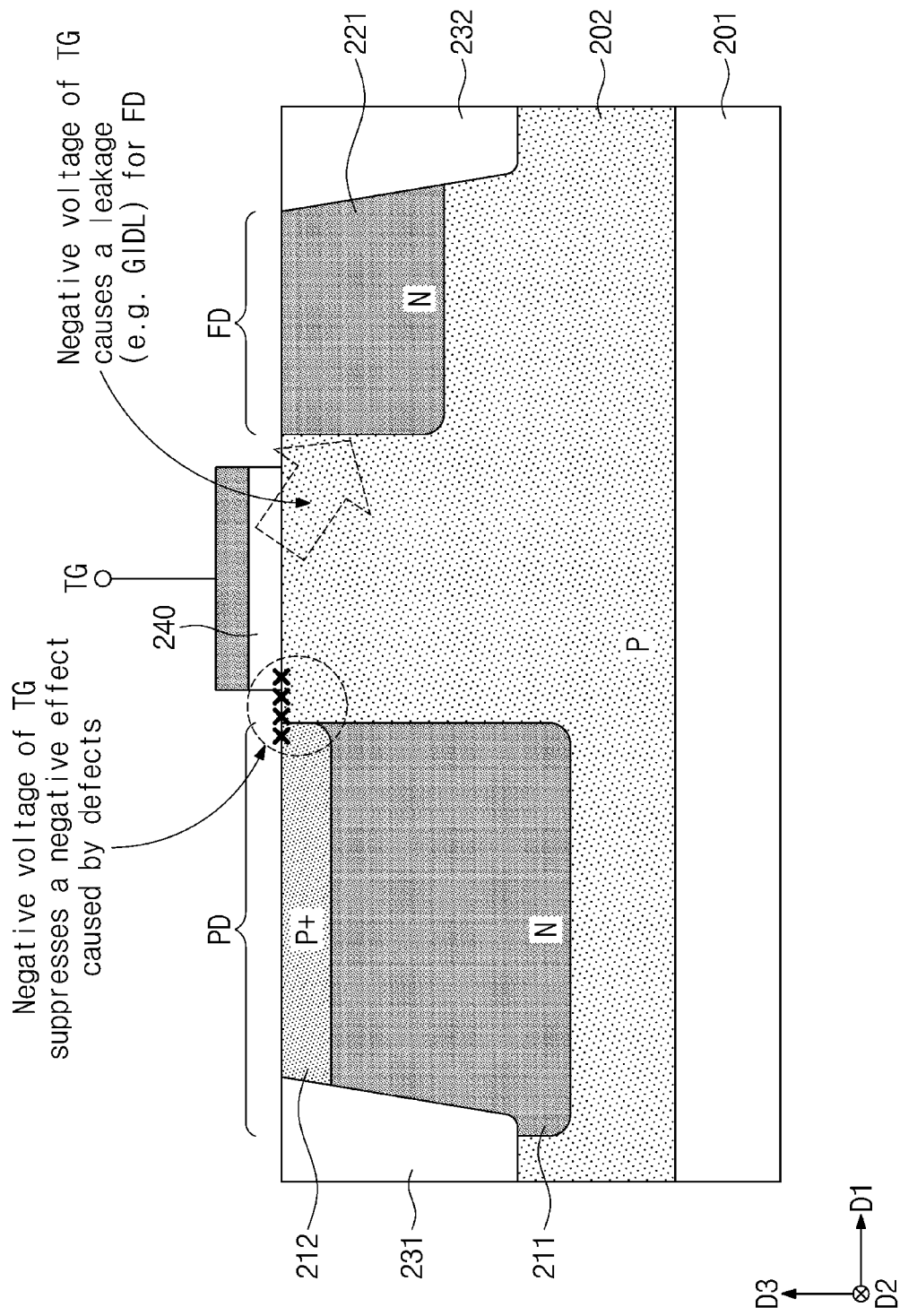
FIG. 5 is a cross-sectional view illustrating a transfer transistor, according to some embodiments.

FIG. 5 is a cross-sectional view illustrating a transfer transistor, according to some embodiments. A cross-sectional view of a transfer transistor is illustrated in FIG. 5. The transfer transistor may correspond to the transfer transistor MT of FIG. 4. The transfer transistor may be connected between the photo diode PD and the floating diffusion node FD and may be controlled by the transfer gate signal TG.

A semiconductor substrate 201 may be provided in parallel with a plane defined by the first direction D1 and the second direction D2. A semiconductor well area 202 may be formed on/in the semiconductor substrate 201. The semiconductor well area 202 may be a P-type area. The photo diode PD, the transfer transistor, and the floating diffusion node FD may be formed on the semiconductor well area 202.

The photo diode PD may be formed of a P-type semiconductor region 212 and an N-type semiconductor region 211 in a stacked shape. Here, the P-type semiconductor region 212 may be a highly doped P-type impurity region. The floating diffusion node FD may be an N-type impurity region.

The transfer transistor may be implemented by using the photo diode PD, a transfer gate electrode for receiving the transfer gate signal TG, and the floating diffusion node FD. The transfer gate electrode may be formed on a gate insulating layer 240. Although not illustrated in FIG. 5, the floating diffusion node FD may be electrically connected with a source electrode of the reset transistor MR of FIG. 4 and a gate electrode of the source follower transistor MSF of FIG. 4 through a line (or interconnection).

A separation region 231 may be formed on one side of the photo diode PD. For example, the separation region 231 may be in close contact with the photo diode PD in the first direction D1, and the separation region 231 may extend in a direction opposite to the third direction D3. For example, the separation region 231 may be a highly doped P-type impurity region. The separation region 231 may electrically separate the photo diode PD from any other element(s) (e.g., transistors of any other pixel). As in the above description, a separation region 232 may be formed on one side of the floating diffusion node FD. The separation region 232 may electrically separate the floating diffusion node FD from any other element(s).

In some embodiments, a defect may occur under the transfer gate electrode. A negative effect due to the defect may be suppressed by decreasing a turn-off voltage level of the transfer gate signal TG. The turn-off voltage level may indicate a voltage level preventing a channel of the transfer transistor from being formed.

In more detail, a defect may occur at an upper portion of the semiconductor well area 202, which faces the gate insulating layer 240. The defect may refer to an unintended defect occurring in the process of actually manufacturing a semiconductor device. While the transfer transistor is turned off by the transfer gate signal TG of the turn-off voltage level, the defect may allow charges of the photo diode PD to be diffused to the floating diffusion node FD. The diffusion of charges due to the defect may cause a white spot, a dark current, and the like, that is, may cause the degradation of the quality of image data.

A way to decrease a turn-off voltage level of the transfer gate signal TG may be used to prevent the degradation of the quality of image data. For example, the formation of the channel of the transfer transistor may be strongly blocked by setting the turn-off voltage level of the transfer gate signal TG to a negative voltage lower than a ground voltage, and thus, a negative effect due to the defect may be suppressed.

However, as the turn-off voltage level of the transfer gate signal TG decreases, an electric field between the transfer gate electrode and the semiconductor well area 202 may be formed more strongly. As such, a negative effect due to a leakage such as a gate induced drain leakage (GIDL) may occur at the floating diffusion node FD. As charges of the floating diffusion node FD are discharged by the leakage, the quality of image data may be degraded.

As described above, while charges are accumulated by the photo diode PD, to suppress the negative effect due to the defect, there is a need to decrease the turn-off voltage level of the transfer gate signal TG. However, during the readout period in which the accumulated charges of the photo diode PD are read out, to suppress the negative effect due to the leakage, there is a need to increase the turn-off voltage level of the transfer gate signal TG.

Figure 6:
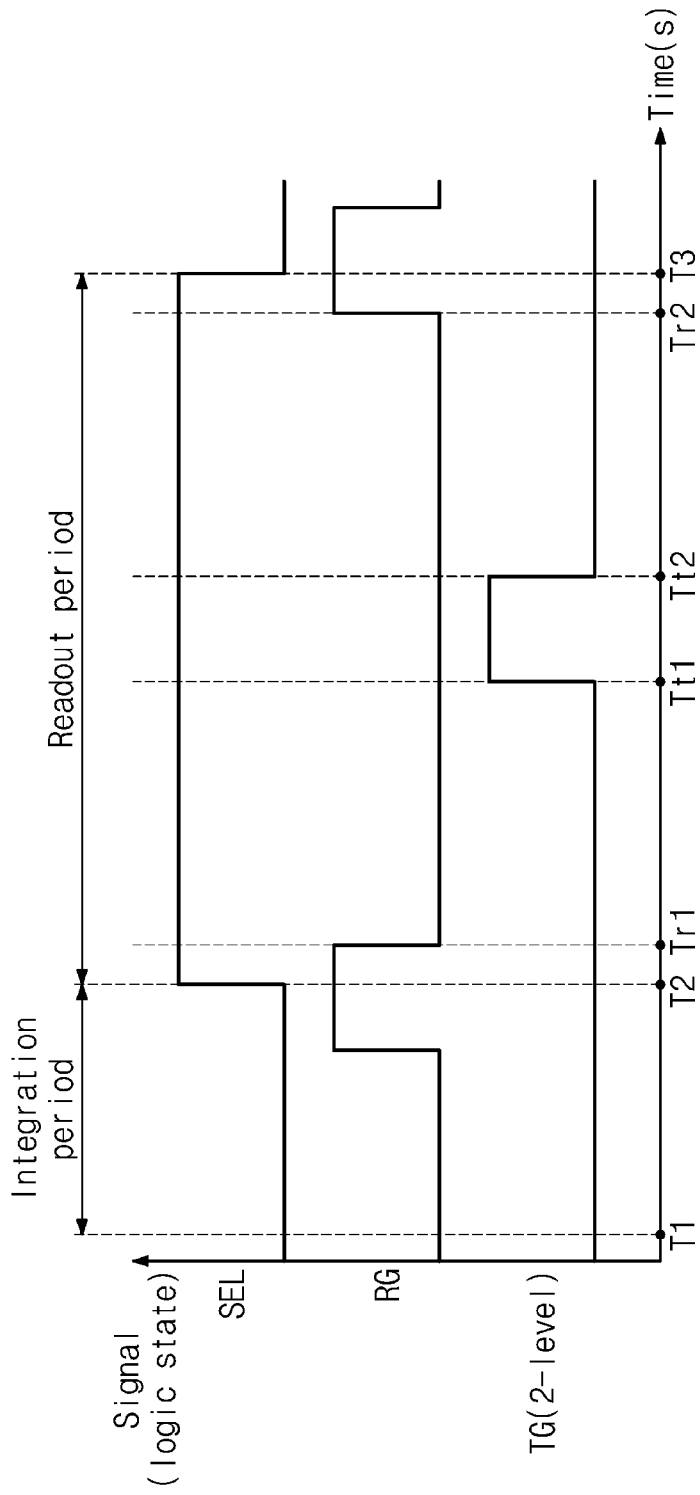
FIG. 6 is a timing diagram for describing signals of a related art image sensor.

FIG. 6 is a timing diagram for describing signals of a related art image sensor. Waveforms of the select signal SEL, the reset gate signal RG, and the transfer gate signal TG that are used in a related art image sensor are illustrated in FIG. 6. A related art transfer gate signal TG may have two voltage levels. In FIG. 6, a horizontal axis represents a time. A vertical axis represents a logic state of a signal.

An image sensor may include pixels. A pixel may include a photo diode, a transfer transistor, a reset transistor, a source follower transistor, and a select transistor. The select signal SEL may control the select transistor. The reset gate signal RG may control the reset transistor. The transfer gate signal TG may control the transfer transistor.

A time period from T1 to T2 is referred to as an "integration period". The integration period may indicate a period in which the photo diode accumulates charges.

In the integration period, the select signal SEL may be maintained at a turn-off voltage level. The reset gate signal RG may change from the turn-off voltage level to a turn-on voltage level. The transfer gate signal TG may be maintained at the turn-off voltage level.

A time period from T2 to T3 is referred to as a "readout period". The readout period may be a time period after the integration period. The readout period may be a period in which charges accumulated by the photo diode of the pixel during the integration period are read out. For example, during the readout period, the image sensor may diffuse the accumulated charges of the photo diode to the floating diffusion node and may generate a corresponding output signal based on a voltage level of the floating diffusion node.

The readout period may include points in time Tr1, Tt1, Tt2, and Tr2. The select signal SEL may be maintained at the turn-on voltage level during the readout period, but embodiments are not limited thereto.

At the point in time Tr1, the reset gate signal RG may change from the turn-on voltage level to the turn-off voltage level. That is, the floating diffusion node may be completely reset by the reset transistor at the point in time Tr1, and the floating diffusion node may be floated.

At the point in time Tt1, the transfer gate signal TG may change from the turn-off voltage level to the turn-on voltage level. Here, the turn-on voltage level may be higher than the turn-off voltage level as illustrated in FIG. 6. At the point in time Tt2, the transfer gate signal TG may change from the turn-on voltage level to the turn-off voltage level. That is, the channel of the transfer transistor MT may be formed during a time period from Tt1 to Tt2.

At the point in time Tr2, the reset gate signal RG may change from the turn-off voltage level to the turn-on voltage level. That is, the floating diffusion node may be reset by the reset transistor at the point in time Tr2.

As described above, the transfer gate signal TG may have the turn-on voltage level during the time period from Tt1 to Tt2 and may have the turn-off voltage level during the remaining time periods. As described with reference to FIG. 5, when the turn-off voltage level of the transfer gate signal TG is set too low, the negative effect due to the leakage may occur, but when the turn-off voltage level of the transfer gate signal TG is set too high, the negative effect due to the defect may occur.

According to various embodiments, to improve the quality of image data, a technique may be used that applies two kinds of turn-off voltage levels depending on time periods. In other words, an image sensor may be used that has the transfer gate signal TG having three voltage levels.

Figure 7:
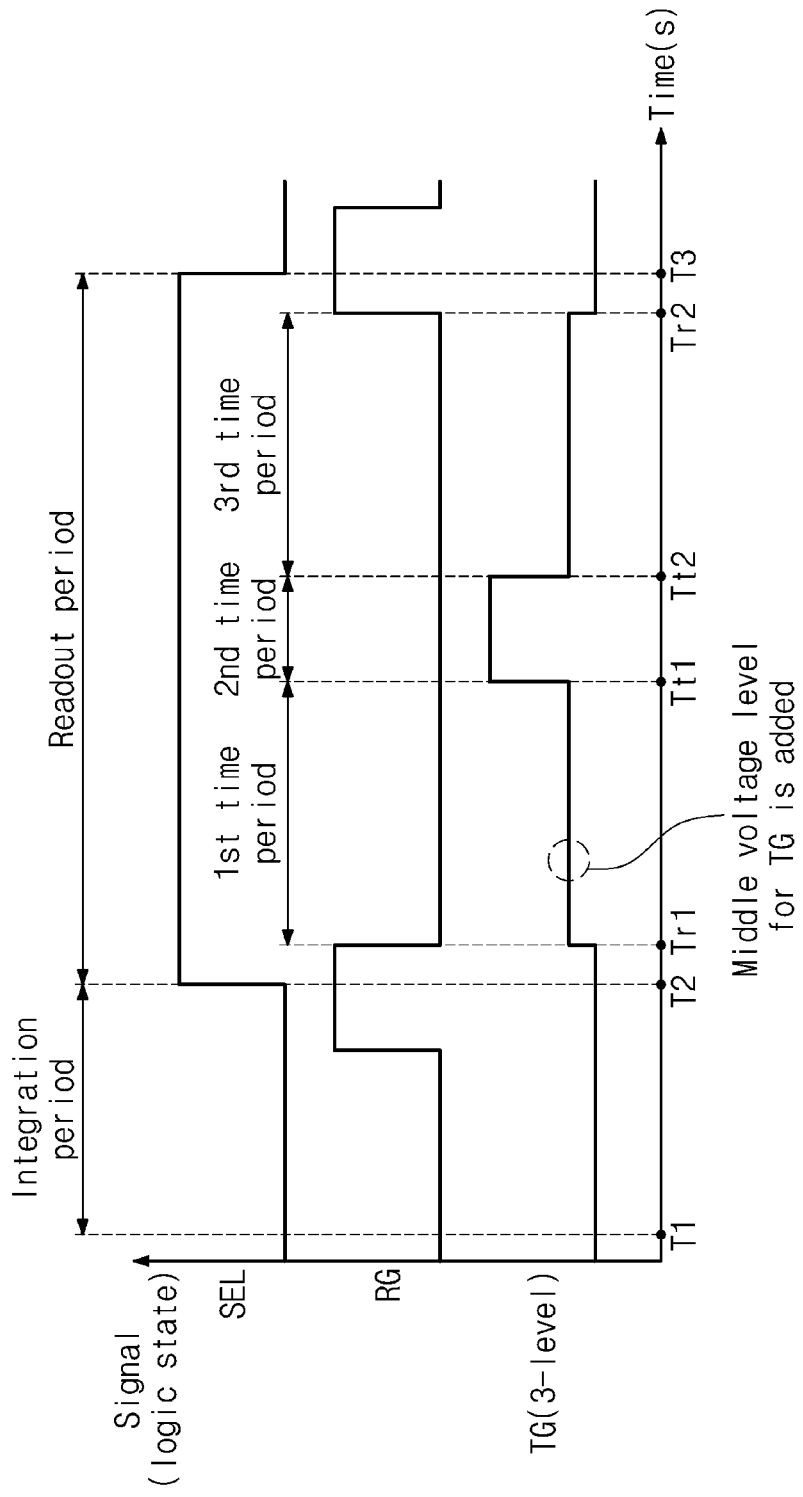
FIG. 7 is a timing diagram describing signals of an image sensor, according to some embodiments.

FIG. 7 is a timing diagram describing signals of an image sensor, according to some embodiments. An image sensor may include the pixel PIX of FIG. 4. Waveforms of the select signal SEL, the reset gate signal RG, and the transfer gate signal TG that are used in the image sensor according to some embodiments are illustrated in FIG. 7. The transfer gate signal TG may have three voltage levels. In FIG. 7, a horizontal axis represents a time. A vertical axis represents a logic state of a signal.

The image sensor may include the pixel PIX. The pixel PIX may include the photo diode PD, the transfer transistor MT, the reset transistor MR, the source follower transistor MSF, and the select transistor MSL. The select signal SEL may control the select transistor MSL. The reset gate signal RG may control the reset transistor MR. The transfer gate signal TG may control the transfer transistor MT.

According to some embodiments, the image sensor may use the transfer gate signal TG having three voltage levels. In more detail, the transfer gate signal TG may have the first voltage level, the second voltage level, or the third voltage level. For example, the first voltage level may be a negative voltage lower than the ground voltage. The first voltage level may inhibit the channel of the transfer transistor MT from being formed. The second voltage level may be higher than the first voltage level and may prevent the channel of the transfer transistor MT from being formed. The third voltage level may be higher than the second voltage level and may allow the channel of the transfer transistor MT to be formed. That is, unlike the transfer gate signal TG of FIG. 6, the transfer gate signal TG of FIG. 7 may further have the second voltage level being a middle voltage level.

A time period from T1 to T2 is referred to as an "integration period". The integration period may indicate a period in which the photo diode PD accumulates charges.

In the integration period, the select signal SEL may be maintained at the turn-off voltage level. The reset gate signal RG may change from the turn-off voltage level to the turn-on voltage level during the integration period. The transfer gate signal TG may be maintained at the first voltage level. While charges are accumulated by the photo diode PD, because a negative voltage is applied to the gate of the transfer transistor MT, the negative effect due to the defect may be suppressed.

A time period from T2 to T3 is referred to as a "readout period". The readout period may refer to a period in which the pixel PIX generates an output signal based on the charges accumulated by the photo diode PD. The readout period may include a first time period, a second time period, and a third time period. The first time period may be a time period from Tr1 to Tt1. The second time period may be a time period from Tt1 to Tt2. The third time period may be a time period from Tt2 to Tr2. During the readout period, the select signal SEL may be maintained at the turn-on voltage level.

At the point in time Tr1, the reset gate signal RG may change from the turn-on voltage level to the turn-off voltage level. That is, the floating diffusion node FD may be completely reset by the reset transistor MR at the point in time Tr1, and the floating diffusion node FD may be floated. The transfer gate signal TG may change from the first voltage level to the second voltage level. That is, a voltage level of the gate of the transfer transistor MT may increase.

During the first time period, the select signal SEL may be maintained at the turn-on voltage level. The reset gate signal RG may be maintained at the turn-off voltage level. The transfer gate signal TG may be maintained at the second voltage level. In this case, because the transfer transistor MT is biased with the second voltage level higher than the first voltage level, the negative effect due to the leakage to the floating diffusion node FD may be suppressed.

At the point in time Tt1, the transfer gate signal TG may change from the second voltage level to the third voltage level. The channel of the transfer transistor MT may be formed in response to the transfer gate signal TG of the third voltage level such that the photo diode PD and the floating diffusion node FD are connected.

During the second time period, the select signal SEL may be maintained at the turn-on voltage level. The reset gate signal RG may be maintained at the turn-off voltage level. The transfer gate signal TG may be maintained at the third voltage level. Because the transfer transistor MT is turned on, the charges accumulated by the photo diode PD may be diffused to the floating diffusion node FD through the transfer transistor MT.

In some embodiments, as a length of the second time period increases, charges may be smoothly transferred (moved) from the photo diode PD to the floating diffusion node FD. When an external environment is determined as dark (i.e., when the amount of charges accumulated by the photo diode PD is small), the image processor controlling the image sensor may increase the length of the second time period. When the external environment is determined as bright (i.e., when the amount of charges accumulated by the photo diode PD is great), the image processor controlling the image sensor may decrease the length of the second time period. For example, in some embodiments, the image processor may determine the external environment.

At the point in time Tt2, the transfer gate signal TG may change from the third voltage level to the second voltage level. In this case, the transfer transistor MT may disconnect the photo diode PD from the floating diffusion node FD.

During the third time period, the select signal SEL may be maintained at the turn-on voltage level. The reset gate signal RG may be maintained at the turn-off voltage level. The transfer gate signal TG may be maintained at the second voltage level. As in the first time period, because the transfer transistor MT is biased with the second voltage level higher than the first voltage level, the negative effect due to the leakage to the floating diffusion node FD may be suppressed.

At the point in time Tr2, the reset gate signal RG may change from the turn-off voltage level to the turn-on voltage level. The transfer gate signal TG may change from the second voltage level to the first voltage level. That is, the floating diffusion node FD may be reset by the reset transistor MR at the point in time Tr2. For processing of next image data, the negative voltage may be applied to the gate of the transfer transistor MT, and thus, the negative effect due to the defect may be suppressed.

As described above, according to embodiments, the image sensor using the transfer gate signal TG having three voltage levels, i.e., the first voltage level, the second voltage level, or the third voltage level, is provided. As the transfer transistor MT is biased with the first voltage level during the integration period, the image sensor may suppress the negative effect due to the defect. During the readout period, as the transfer transistor MT is biased with the second voltage level before and after the turn-on of the transfer transistor MT, the image sensor may suppress the negative effect due to the leakage.

Figure 8:
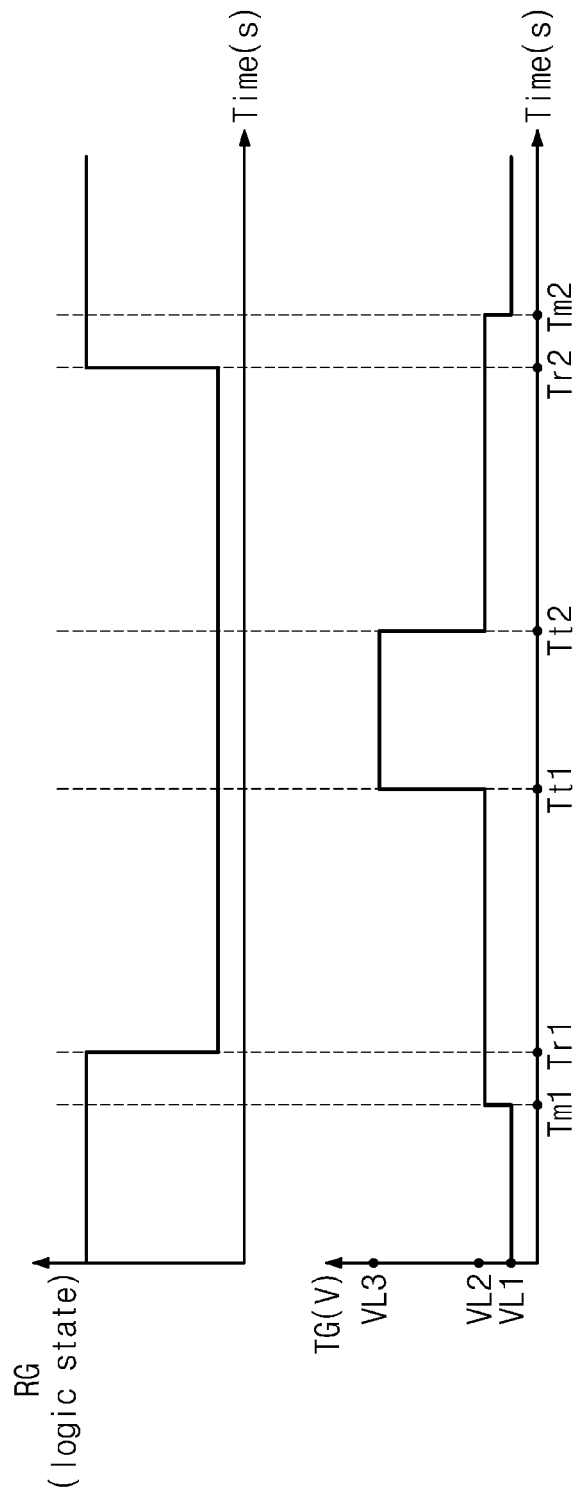
FIG. 8 is a timing diagram illustrating signals of an image sensor in detail, according to some embodiments.

FIG. 8 is a timing diagram illustrating signals of an image sensor in detail, according to some embodiments. An image sensor may include the pixel PIX of FIG. 4. Waveforms of the reset gate signal RG and the transfer gate signal TG that are used in the image sensor according to some embodiments are illustrated in FIG. 8. The transfer gate signal TG may have a first voltage level VL1, a second voltage level VL2, or a third voltage level VL3. In FIG. 8, a horizontal axis represents a time. A vertical axis represents a logic state or a voltage level of a signal.

According to some embodiments, unlike the timing diagram of FIG. 7, a time at which the voltage level of the transfer gate signal TG changes may be different from a time at which the voltage level of the reset gate signal RG changes.

For example, at a point in time Tm1, the transfer gate signal TG may change from the first voltage level VL1 to the second voltage level VL2. At the point in time Tr1, the reset gate signal RG may change from the turn-on voltage level to the turn-off voltage level. At the point in time Tr2, the reset gate signal RG may change from the turn-off voltage level to the turn-on voltage level. At a point in time Tm2, the transfer gate signal TG may change from the second voltage level VL2 to the first voltage level VL1. In this case, the point in time Tm1 may be earlier than the point in time Tr1. In this case, the point in time Tm2 may be later than the point in time Tr2.

During a reset operation using the reset gate signal RG illustrated in FIG. 8, because a bias voltage of the transfer transistor MT becomes higher, the voltage level of the floating diffusion node FD may be stably maintained. In more detail, regardless of the voltage level of the transfer gate signal TG changing from the first voltage level VL1 to the second voltage level VL2, the floating diffusion node FD may have a voltage level corresponding to the power supply voltage Vdd after the reset operation.

In some embodiments, a length of the time period from Tm1 to Tr1 may be equal to a length of the time period from Tr2 to Tm2. For example, a time period from a time at which the turn-off voltage level of the transfer transistor MT changes to a time at which a first reset operation is completed may be equal to a time period from a time at which a second reset operation starts to a time at which the turn-off voltage level of the transfer transistor MT changes.

As described above, according to some embodiments, the image sensor in which the turn-off voltage level of the transfer gate signal TG increases while the floating diffusion node FD is reset by the reset transistor MR may be provided.

Figure 9:
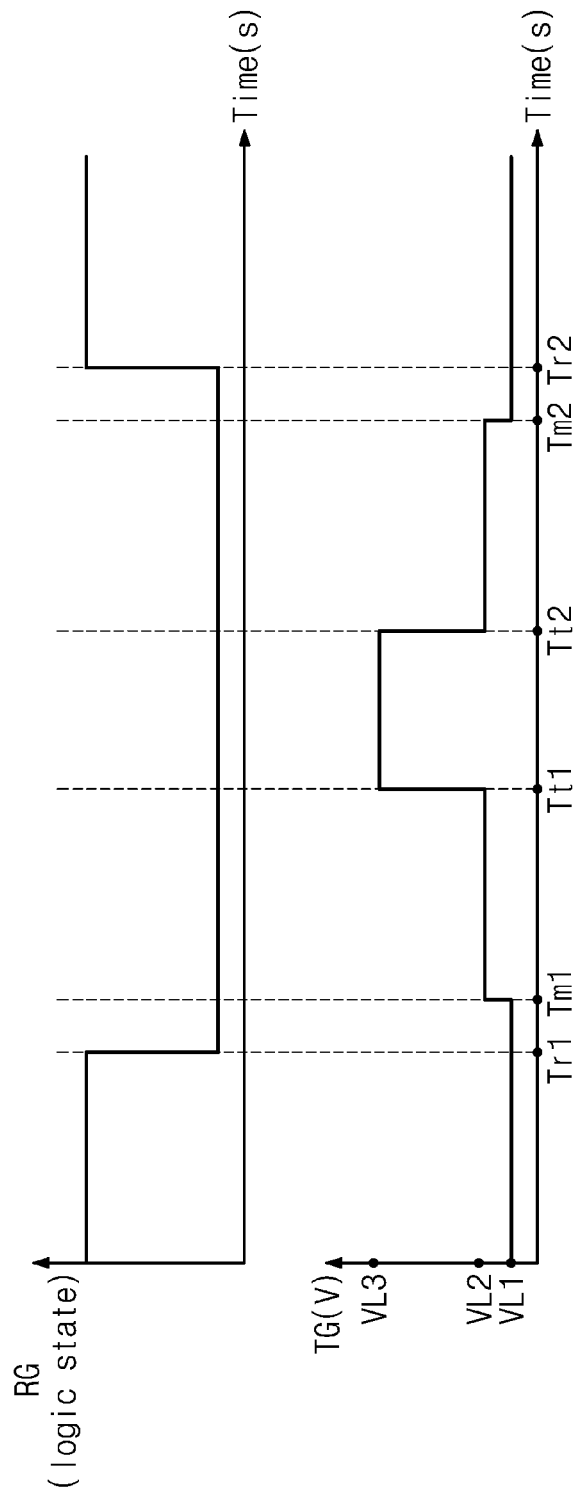
FIG. 9 is a timing diagram illustrating signals of an image sensor in detail, according to some embodiments.

FIG. 9 is a timing diagram illustrating signals of an image sensor in detail, according to some embodiments. An image sensor may include the pixel PIX of FIG. 4. Waveforms of the reset gate signal RG and the transfer gate signal TG that are used in the image sensor according to some embodiments are illustrated in FIG. 9. The transfer gate signal TG may have the first voltage level VL1, the second voltage level VL2, or the third voltage level VL3. In FIG. 9, a horizontal axis represents a time. A vertical axis represents a logic state or a voltage level of a signal.

According to some embodiments, unlike the timing diagram of FIG. 7, a time at which the voltage level of the transfer gate signal TG changes may be different from a time at which the voltage level of the reset gate signal RG changes.

For example, at the point in time Tr1, the reset gate signal RG may change from the turn-on voltage level to the turn-off voltage level. At the point in time Tm1, the transfer gate signal TG may change from the first voltage level VL1 to the second voltage level VL2. At the point in time Tm2, the transfer gate signal TG may change from the second voltage level VL2 to the first voltage level VL1. At the point in time Tr2, the reset gate signal RG may change from the turn-off voltage level to the turn-on voltage level. In this case, the point in time Tm1 may be later than the point in time Tr1. The point in time Tm2 may be earlier than the point in time Tr2.

After the reset operation using the reset gate signal RG, because a bias voltage of the transfer transistor MT becomes higher, a voltage difference between the photo diode PD and the floating diffusion node FD may increase, and thus, charges may be smoothly transferred. In more detail, after the reset operation using the reset gate signal RG, the floating diffusion node FD may be floated. When the transfer gate signal TG changes from the first voltage level VL1 to the second voltage level VL2, the voltage level of the floating diffusion node FD may decrease. Because the voltage difference between the photo diode PD and the floating diffusion node FD increases, while the channel of the transfer transistor MT is formed (i.e., during a time period from Tt1 to Tt2), charges may be smoothly transferred from the photo diode PD to the floating diffusion node FD.

In some embodiments, a length of the time period from Tr1 to Tm1 may be equal to a length of the time period from Tm2 to Tr2. For example, a time period from a time at which the first reset operation is completed to a time at which the turn-off voltage level of the transfer transistor MT changes may be equal to a time period from a time at which the turn-off voltage level of the transfer transistor MT changes to a time at which the second reset operation starts.

As described above, according to some embodiments, the image sensor in which the turn-off voltage level of the transfer gate signal TG increases after the floating diffusion node FD is reset by the reset transistor MR may be provided.

Figure 10A:
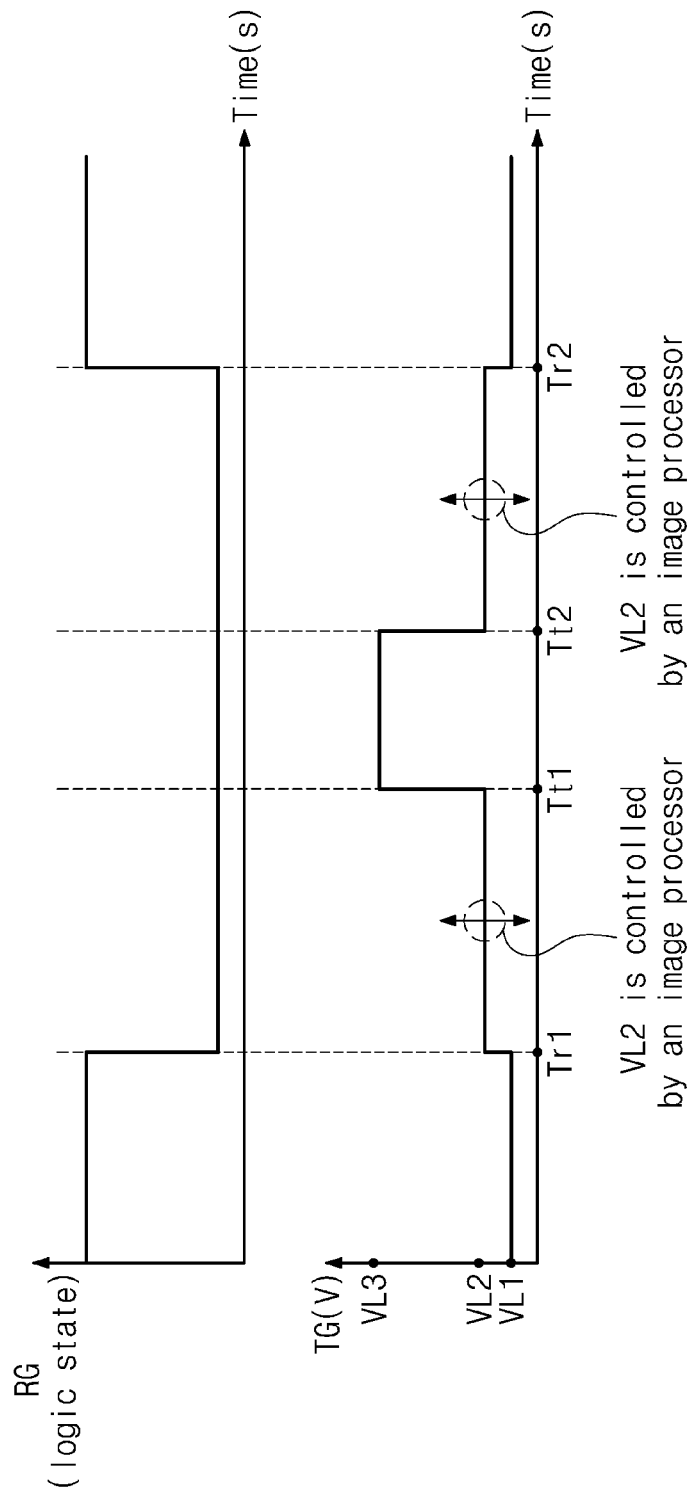
FIGS. 10A and 10B are timing diagrams illustrating signals of an image sensor in detail, according to some embodiments.
Figure 10B:
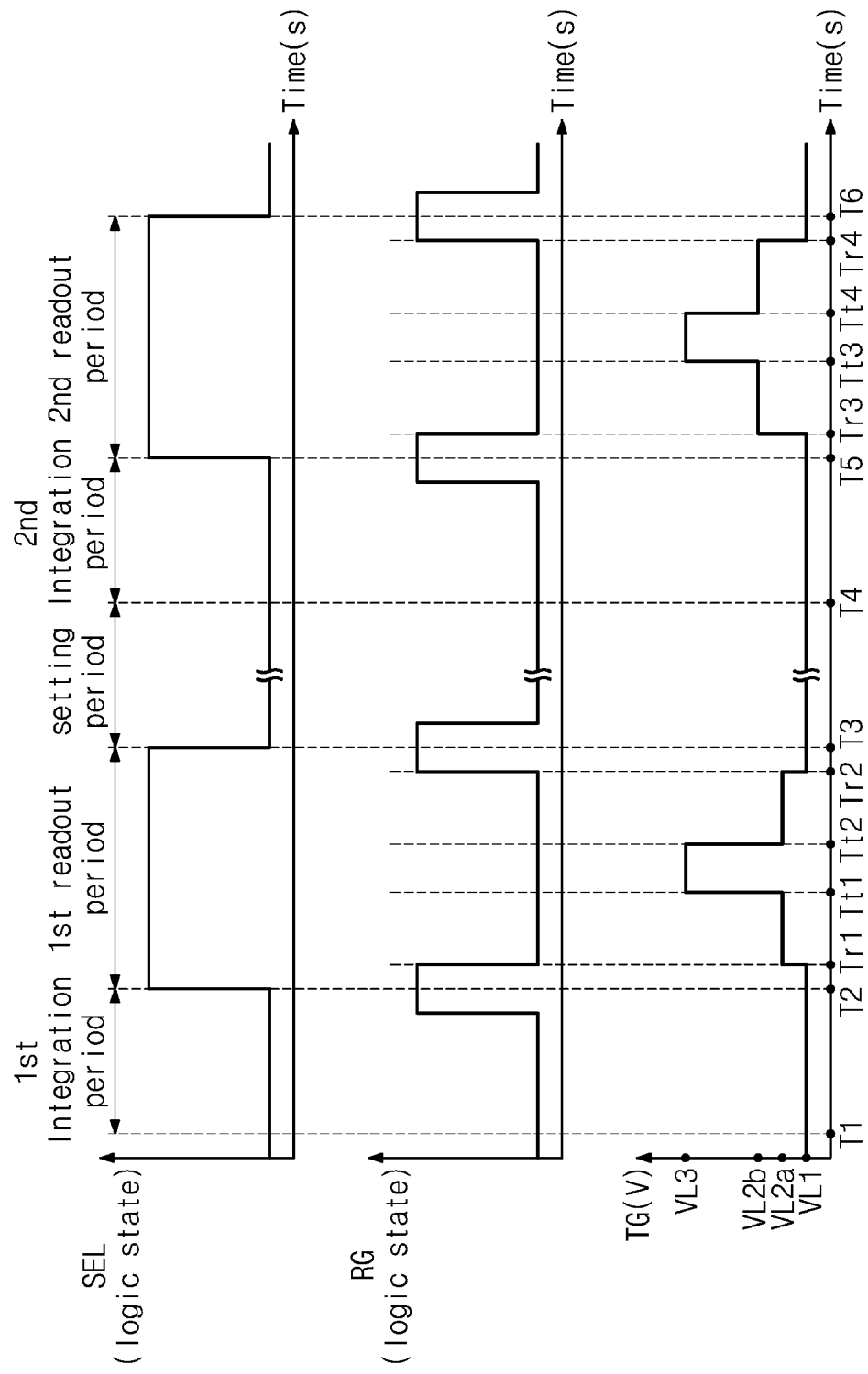

FIGS. 10A and 10B are timing diagrams illustrating signals of an image sensor in detail, according to some embodiments. FIG. 10A illustrates a waveform of the reset gate signal RG and a waveform of the transfer gate signal TG in which the second voltage level being a middle voltage level is adjusted. The reset gate signal RG and the transfer gate signal TG may be used in the image sensor including the pixel PIX of FIG. 4.

Waveforms of the reset gate signal RG and the transfer gate signal TG that are used in the image sensor according to some embodiments are illustrated in FIG. 10A. The transfer gate signal TG may have the first voltage level VL1, the second voltage level VL2, or the third voltage level VL3. The second voltage level VL2 may increase or decrease. In FIG. 10A, a horizontal axis represents a time. A vertical axis represents a logic state or a voltage level of a signal.

According to some embodiments, unlike the timing diagrams of FIGS. 7, 8, and 9, the second voltage level VL2 may be variable. For example, an image processor may adjust the second voltage level VL2 that is generated by a row driver of the image sensor. The second voltage level VL2 may be adjusted within a range that is higher than the first voltage level VL1 and is lower than the third voltage level VL3.

When the second voltage level VL2 is adjusted lower within the range from the first voltage level VL1 to the third voltage level VL3, the negative effect due to the defect, such as a white spot or a dark current, may be suppressed. In contrast, when the second voltage level VL2 is adjusted lower within the range from the first voltage level VL1 to the third voltage level VL3, the negative effect due to the leakage such as the GIDL may occur. Meanwhile, when the second voltage level VL2 is adjusted higher within the range from the first voltage level VL1 to the third voltage level VL3, the negative effect due to the leakage may be suppressed. In contrast, when the second voltage level VL2 is adjusted higher within the range from the first voltage level VL1 to the third voltage level VL3, the negative effect due to the defect may occur.

The image processor may increase or decrease the second voltage level VL2 of the transfer gate signal TG, which is generated by the row driver of the image sensor, in consideration of image data generated in a previous period, external brightness, a temperature of the image sensor, application settings, user settings, and/or the like.

FIG. 10B illustrates waveforms of the select signal SEL, the reset gate signal RG, and the transfer gate signal TG in which the second voltage level being a middle voltage level is adjusted. The select signal SEL, the reset gate signal RG, and the transfer gate signal TG may be used in the image sensor including the pixel PIX of FIG. 4.

Waveforms of the select signal SEL, the reset gate signal RG, and the transfer gate signal TG that are used in the image sensor according to some embodiments are illustrated in FIG. 10B. The transfer gate signal TG may have the first voltage level VL1, a second low voltage level VL2a, a second high voltage level VL2b, or the third voltage level VL3. In FIG. 10B, a horizontal axis represents a time. A vertical axis represents a logic state or a voltage level of a signal.

A time period from T1 to T2 is referred to as a "first integration period". The first integration period may indicate a first time period in which the photo diode PD accumulates charges.

A time period from T2 to T3 is referred to as a "first readout period". The first readout period may indicate a period in which the pixel PIX processes charges accumulated by the photo diode PD in the first integration period. In a time period from Tr1 to Tt1, the transfer gate signal TG may be maintained at the second low voltage level VL2a. In a time period from Tt1 to Tt2, the transfer gate signal TG may be maintained at the third voltage level VL3. In a time period from Tt2 to Tr2, the transfer gate signal TG may be maintained at the second low voltage level VL2a.

A time period from T3 to T4 is referred to as a "setting period". In the setting period, the image processor 11 of FIG. 1 may adjust a voltage level to be used for the middle voltage level of the transfer gate signal TG of the row driver 110. For example, the image processor 11 may change the middle voltage level of the transfer gate signal TG of the row driver 110 from the second low voltage level VL2a to the second high voltage level VL2b. When the setting change of the transfer gate signal TG in the setting period is completed, the transfer gate signal TG may have the first voltage level VL1, the second high voltage level VL2b, or the third voltage level VL3 until the setting change is again made.

A time period from T4 to T5 is referred to as a "second integration period". The second integration period may indicate a second time period in which the photo diode PD accumulates charges.

A time period from T5 to T6 is referred to as a "second readout period". The second readout period may indicate a period in which the pixel PIX processes charges accumulated by the photo diode PD in the second integration period. In a time period from Tr3 to Tt3, the transfer gate signal TG may be maintained at the second high voltage level VL2b. In a time period from Tt3 to Tt4, the transfer gate signal TG may be maintained at the third voltage level VL3. In a time period from Tt4 to Tr4, the transfer gate signal TG may be maintained at the second high voltage level VL2b.

As described above, an example in which the second voltage level being the middle voltage level of the transfer gate signal TG changes is described with reference to FIGS. 10A and 10B. For better understanding of the embodiments, the timing diagram in which the middle voltage level of the transfer gate signal TG is changed from the second low voltage level VL2a to the second high voltage level VL2b (i.e., is increased) is illustrated in FIG. 10B, but embodiments are not limited thereto. Unlike the example of FIG. 10B, under control of the image processor, the middle voltage level of the transfer gate signal TG may be changed from the second high voltage level VL2b to the second low voltage level VL2a (i.e., may be decreased). Also, there may be further used various middle voltage levels in addition to the voltage levels VL2a and VL2b. For example, in some embodiments, the image processor may adjust the middle voltage level to stepwise increase or decrease in successive setting periods. In other embodiments, the image processor may adjust the middle voltage level to first increase in a first setting period and then in a later setting period to decrease.

Figure 11:
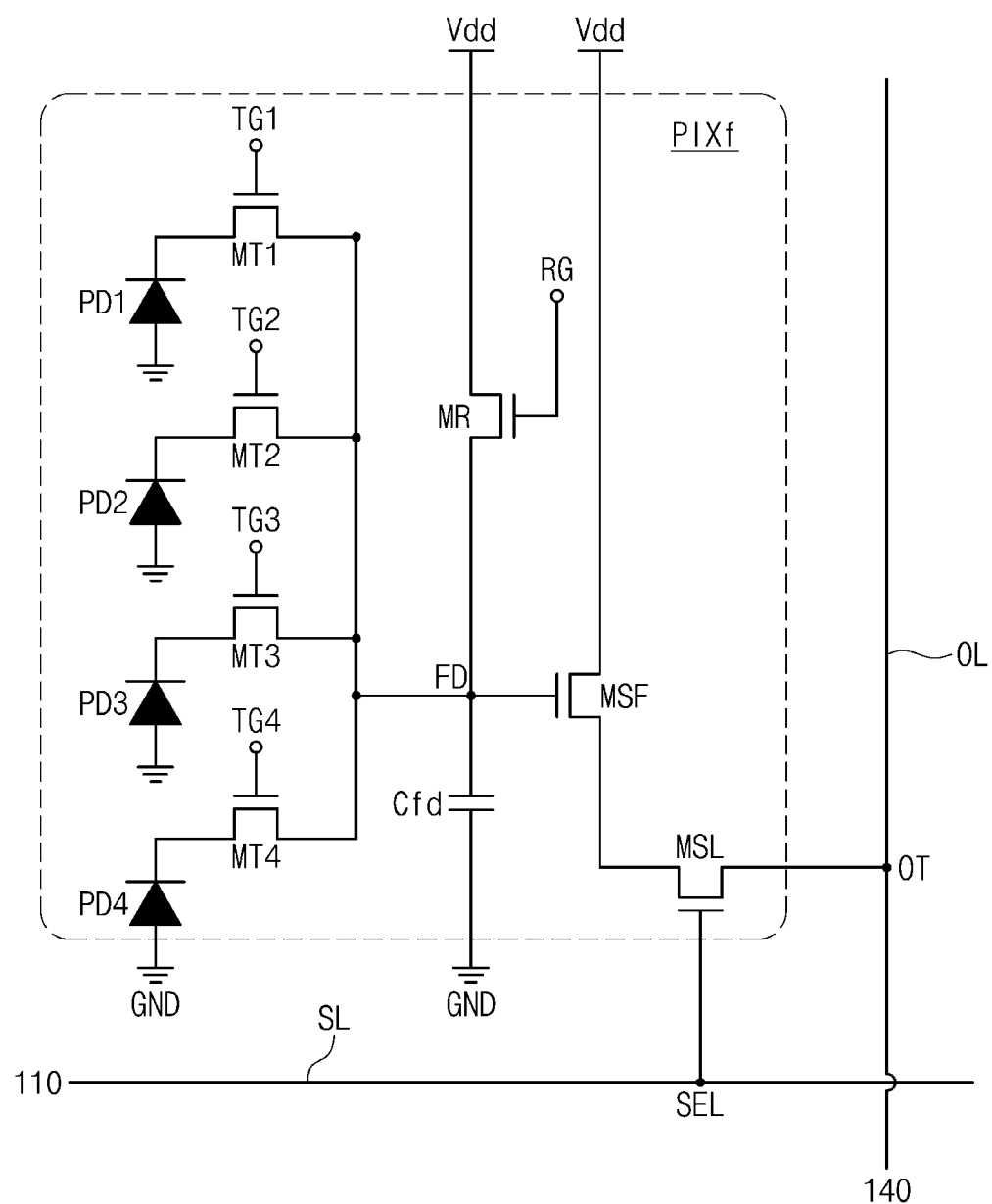
FIG. 11 is a circuit diagram illustrating a pixel of the image sensor of FIG. 2 in detail, according to some embodiments.

FIG. 11 is a circuit diagram illustrating a pixel of FIG. 2 in detail, according to some embodiments. A pixel PIXf of FIG. 11 may correspond to the pixel PIX of the pixel array 120 of FIG. 2. A first transfer gate signal TG1, a second transfer gate signal TG2, a third transfer gate signal TG3, and a fourth transfer gate signal TG4 may correspond to the transfer gate signal TG of FIG. 2.

Referring to FIGS. 2 and 11, the pixel PIXf may be connected with the row driver 110 and the analog-to-digital converter 140. The pixel PIXf may receive the select signal SEL, the reset gate signal RG, and the first to fourth transfer gate signals TG1, TG2, TG3, and TG4 from the row driver 110. The pixel PIXf may operate based on the power supply voltage Vdd and the ground voltage GND. The pixel PIXf may detect a light and may generate the output signal OT including image data.

According to some embodiments, the pixel PIXf may be implemented with a four-shared structure in which a first photo diode PD1, a second photo diode PD2, a third photo diode PD3, and a fourth photo diode PD4 share the floating diffusion node FD.

The pixel PIXf may include the first to fourth photo diodes PD1, PD2, PD3, and PD4, a first transfer transistor MT1, a second transfer transistor MT2, a third transfer transistor MT3, and a fourth transfer transistor MT4, the floating diffusion node FD, the capacitor Cfd, the reset transistor MR, the source follower transistor MSF, and the select transistor MSL. The pixel PIXf may be connected with the selection line SL and the output line OL.

Characteristics, structures, and functions of the capacitor Cfd, the reset transistor MR, the source follower transistor MSF, the select transistor MSL, the selection line SL, and the output line OL are similar to those described with reference to FIG. 4, and thus, additional description will be omitted to avoid redundancy.

The first photo diode PD1 may detect a light reflected from an external object and may accumulate charges. The first photo diode PD1 may provide the accumulated charges to the floating diffusion node FD through the first transfer transistor MT1. The first transfer transistor MT1 may be controlled by the first transfer gate signal TG1.

In some embodiments, the first transfer gate signal TG1 may have the first voltage level, the second voltage level, or the third voltage level. The second voltage level may be higher than the first voltage level. The third voltage level may be higher than the second voltage level. In more detail, during the integration period in which the first photo diode PD1 accumulates charges, the first transfer gate signal TG1 may have the first voltage level. During the readout period in which the accumulated charges of the first photo diode PD1 are processed, the first transfer gate signal TG1 may use the second voltage level as the turn-off voltage level and may use the third voltage level as the turn-on voltage level.

As in the above description, the second photo diode PD2 may detect the light and may accumulate charges. The accumulated charges of the second photo diode PD2 may be provided to the floating diffusion node FD through the second transfer transistor MT2. The second transfer transistor MT2 may be controlled by the second transfer gate signal TG2. The second transfer gate signal TG2 may have the three voltage levels.

The third photo diode PD3 may detect the light and may accumulate charges. The accumulated charges of the third photo diode PD3 may be provided to the floating diffusion node FD through the third transfer transistor MT3. The third transfer transistor MT3 may be controlled by the third transfer gate signal TG3. The third transfer gate signal TG3 may have the three voltage levels.

The fourth photo diode PD4 may detect the light and may accumulate charges. The accumulated charges of the fourth photo diode PD4 may be provided to the floating diffusion node FD through the fourth transfer transistor MT4. The fourth transfer transistor MT4 may be controlled by the fourth transfer gate signal TG4. The fourth transfer gate signal TG4 may have the three voltage levels.

Figure 12:
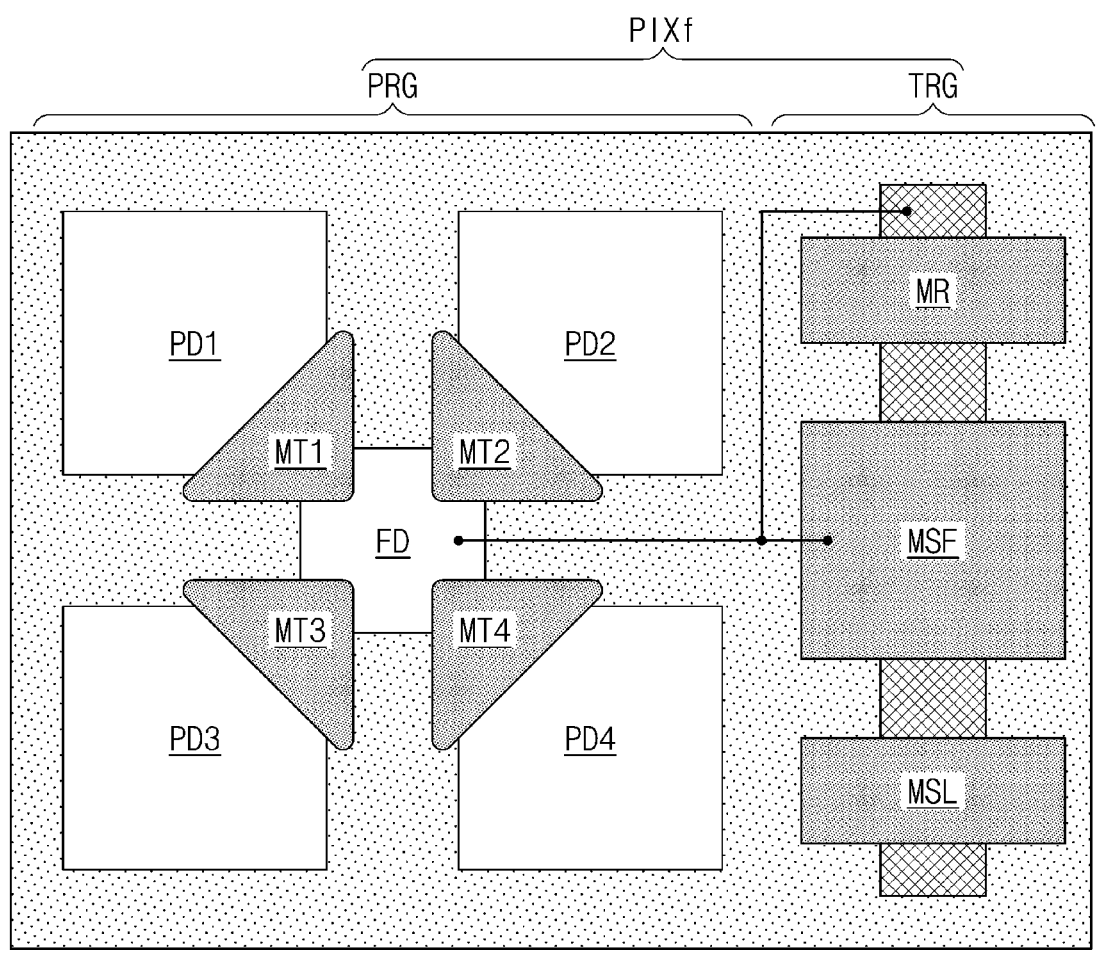
FIG. 12 is a diagram illustrating the pixel of FIG. 11 in detail, according to some embodiments.

FIG. 12 is a diagram illustrating a pixel of FIG. 11 in detail, according to some embodiments. Referring to FIGS. 11 and 12, the pixel PIXf may be implemented with a four-shared structure. The pixel PIXf may include a pixel region PRG and a transistor region TRG.

The pixel region PRG may include the first to fourth photo diodes PD1, PD2, PD3, and PD4, the first to fourth transfer transistors MT1, MT2, MT3, and MT4, and the floating diffusion node FD. The first to fourth photo diodes PD1, PD2, PD3, and PD4 may share the floating diffusion node FD. The first to fourth transfer transistors MT1, MT2, MT3, and MT4 may control the connection of the floating diffusion node FD with the first to fourth photo diodes PD1, PD2, PD3, and PD4. The first to fourth photo diodes PD1, PD2, PD3, and PD4 may be referred to as "first to fourth subpixels" of the pixel PIXf (refer to FIG. 3).

In some embodiments, the second photo diode PD2 may be adjacent to the first photo diode PD1 in the first direction D1. The third photo diode PD3 may be adjacent to the first photo diode PD1 in a direction facing away from the second direction D2. The fourth photo diode PD4 may be adjacent to the third photo diode PD3 in the first direction D1.

The transistor region TRG may include the reset transistor MR, the source follower transistor MSF, and the select transistor MSL.

The reset transistor MR may be connected between the power node having the power supply voltage Vdd and the floating diffusion node FD and may operate in response to the reset gate signal RG. The source follower transistor MSF may be connected between the power node having the power supply voltage Vdd and the select transistor MSL and may operate in response to a voltage level of the floating diffusion node FD. The select transistor MSL may be connected between the source follower transistor MSF and the output line OL and may operate in response to the select signal SEL. For example, the floating diffusion node FD may be connected with a source node of the reset transistor MR and a gate node of the source follower transistor MSF through a line (or interconnection).

Figure 13:
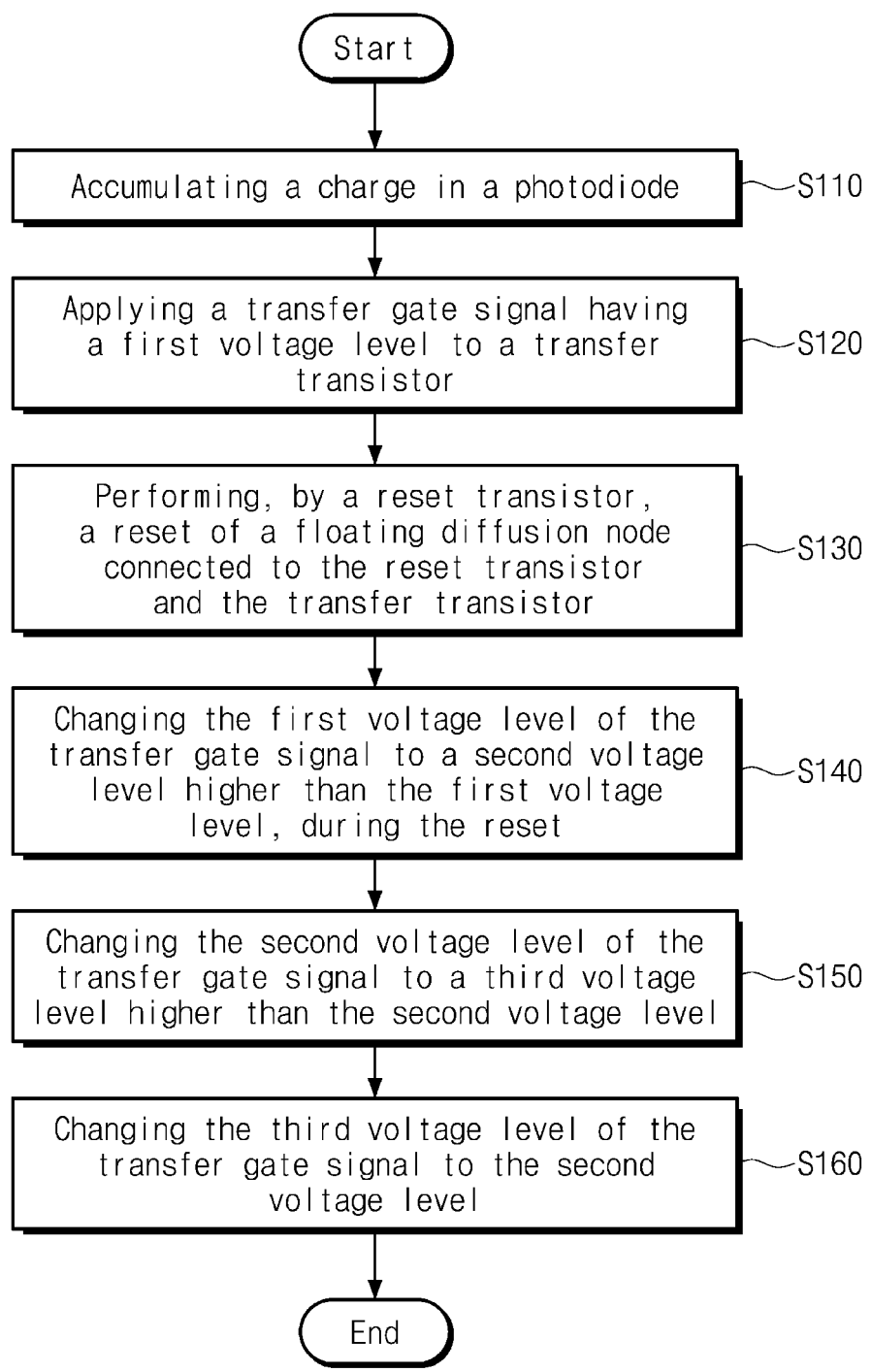
FIG. 13 is a flowchart describing an operation method of an image sensor, according to some embodiments.

FIG. 13 is a flowchart describing an operation method of an image sensor, according to some embodiments. An operation method of an image sensor including a pixel and a row driver will be described with reference to FIG. 13. The image sensor may correspond to the image sensor 100 of FIGS. 1 and 2. The image sensor may include the pixel PIX of FIG. 4 or the pixel PIXf of FIG. 11. The pixel of the image sensor may include a photo diode, a transfer transistor, and a reset transistor. The row driver of the image sensor may control the pixel.

In operation S110, the image sensor may accumulate charges in the photo diode. For example, the photo diode of the image sensor may detect a light reflected from an external object and may accumulate charges. A time period in which the photo diode of the image sensor accumulates charges may be referred as an "integration period".

In operation S120, the image sensor may apply a transfer gate signal having a first voltage level to the transfer transistor. In some embodiments, the first voltage level may be one of turn-off voltage levels of the transfer transistor and may be lower than a voltage level of a ground voltage.

In operation S130, the image sensor may perform, by the reset transistor, a reset of a floating diffusion node connected with the reset transistor and the transfer transistor. For example, the reset gate signal having the turn-on voltage level may be applied to the reset transistor, and the reset transistor may form a channel between a power node having a power supply voltage and the floating diffusion node.

In operation S140, the image sensor may change the first voltage level of the transfer gate signal to the second voltage level during the reset. The second voltage level may be higher than the first voltage level. For example, the second voltage level may be one of the turn-off voltage levels of the transfer transistor.

In some embodiments, as the first voltage level of the transfer gate signal is changed to the second voltage level, a leakage current that occurs at the floating diffusion node of the pixel of the image sensor may decrease.

In operation S150, the image sensor may change the second voltage level of the transfer gate signal to the third voltage level. The third voltage level may be higher than the second voltage level. For example, the third voltage level may be the turn-on voltage level of the transfer transistor. When the third voltage level is applied to the transfer transistor, the transfer transistor may form the channel connecting the photo diode and the floating diffusion node. While the transfer gate signal is maintained at the third voltage level, the charges accumulated by the photo diode in operation S110 may be diffused to the floating diffusion node through the transfer transistor.

In operation S160, the image sensor may change the third voltage level of the transfer gate signal to the second voltage level. When the third voltage level of the transfer gate signal is changed to the second voltage level, the channel of the transfer transistor may not be formed.

In some embodiments, the operation method of the image sensor may further perform an additional reset operation after operation S160. For convenience of description, the reset operation in operation S130 is referred to as a "first reset operation", and the additional reset operation after operation S160 is referred to as a "second reset operation". After operation S160, the operation method of the image sensor may further include performing, by the reset transistor, the second reset operation on the floating diffusion node, and changing the second voltage level of the transfer gate signal to the first voltage level during the second reset operation. A first time period from a time at which the first voltage level of the transfer gate signal is changed to the second voltage level to a time at which the first reset operation in operation S130 is completed may be equal to a second time period from a time at which the second reset operation starts to a time at which the second voltage level of the transfer gate signal is changed to the first voltage level (e.g., refer to FIG. 8).

In some embodiments, the operation method of the image sensor may further include changing, by the row driver, settings for controlling the pixel. For example, the image sensor may communicate with an image processor. The image processor may adjust a waveform of the transfer gate signal that the row driver of the image sensor generates.

In some embodiments, the changing of the settings for controlling the pixel may include changing a middle voltage level (i.e., the second voltage level) of the transfer gate signal. For example, the changing of the setting for controlling the pixel may include allowing the row driver to generate another transfer gate signal having the first voltage level, the third voltage level, or a fourth voltage level, after changing the settings. The fourth voltage level may be the middle voltage level. In more detail, the fourth voltage level may be higher than the first voltage level, may be lower than the third voltage level, and may be different from the second voltage level.

In some embodiments, the operation method of the image sensor may include processing image data depending on the changed settings, after changing the settings. For convenience of description, the reset operation in operation S130 is referred to as a "first reset operation", and an additional reset operation after operation S160 and before changing the settings is referred to as a "second reset operation". The transfer gate signal in operation S120 is referred to as a "first transfer gate signal, and the another transfer gate signal after changing the settings is referred to as a "second transfer gate signal". After the settings are changed, the row driver may generate the second transfer gate signal having the first voltage level, the third voltage level, or the fourth voltage level. The fourth voltage level may be the middle voltage level and may be different from the second voltage level in operation S140.

In this case, the operation method of the image sensor may further include accumulating charges through the photo diode after changing the settings, applying the second transfer gate signal having the first voltage level to the transfer transistor after changing the settings, performing a third reset operation on the floating diffusion node through the reset transistor, changing the first voltage level of the second transfer gate signal to the fourth voltage level during the third reset operation, changing the fourth voltage level of the second transfer gate signal to the third voltage level such that the charges accumulated through the photo diode are diffused to the floating diffusion node through the transfer transistor, and changing the third voltage level of the second transfer gate signal to the fourth voltage level.

As another example, the operation method of the image sensor may further include performing a fourth reset operation on the floating diffusion node through the reset transistor after the third voltage level of the second transfer gate signal is changed to the fourth voltage level, and changing the fourth voltage level of the second transfer gate signal to the first voltage level during the fourth reset operation.

In some embodiments, the changing of the settings for controlling the pixel may include changing a period of the turn-on voltage level of the transfer gate signal. For example, the changing of the settings for controlling the pixel may further include determining a time period in which the second transfer gate signal is maintained at the third voltage level, after changing the settings. The third voltage level may be the turn-on voltage level of the transfer transistor. As the time period in which the second transfer gate signal is maintained at the third voltage level increases, charges may be smoothly transferred from the photo diode to the floating diffusion node.

Figure 14:
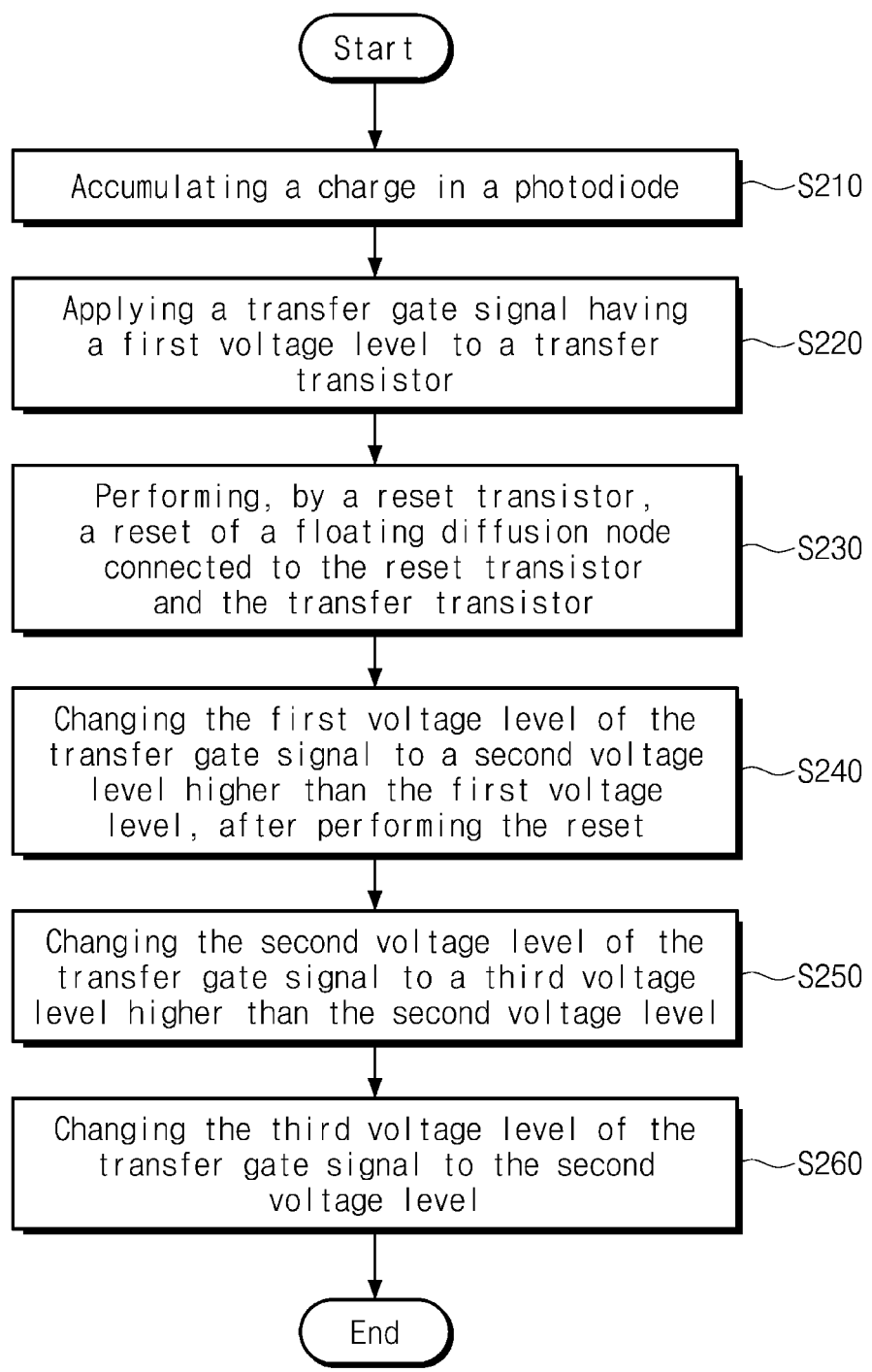
FIG. 14 is a flowchart describing an operation method of an image sensor, according to some embodiments.

FIG. 14 is a flowchart describing an operation method of an image sensor, according to some embodiments. An operation method of an image sensor including a pixel and a row driver will be described with reference to FIG. 14. The image sensor may correspond to the image sensor 100 of FIGS. 1 and 2. The image sensor may include the pixel PIX of FIG. 4 or the pixel PIXf of FIG. 11. The pixel of the image sensor may include a photo diode, a transfer transistor, and a reset transistor. The row driver of the image sensor may control the pixel.

Operation S210, operation S220, operation S230, operation S250, and operation S260 of FIG. 14 may be similar to operation S110, operation S120, operation S130, operation S150, and operation S160 of FIG. 13, and thus, additional description will be omitted to avoid redundancy.

In operation S240, the image sensor may change the first voltage level of the transfer gate signal to the second voltage level, after performing the reset operation in operation S230. For example, in some embodiments, the image sensor may change the first voltage level of the transfer gate signal to the second voltage level, after completing the reset operation. The second voltage level may be higher than the first voltage level.

In some embodiments, the operation method of the image sensor may further perform an additional reset operation after operation S260. For convenience of description, the reset operation in operation S230 is referred to as a "first reset operation", and the additional reset operation is referred to as a "second reset operation". After operation S260, the operation method of the image sensor may further include changing the second voltage level of the transfer gate signal to the first voltage level, and performing, by the reset transistor, the second reset operation on the floating diffusion node after changing the second voltage level of the transfer gate signal to the first voltage level. A first time period from a time at which the first reset operation in operation S230 is completed to a time at which the first voltage level of the transfer gate signal is changed to the second voltage level may be equal to a second time period from a time at which the second voltage level of the transfer gate signal is changed to the first voltage level to a time at which the second reset operation starts (e.g., refer to FIG. 9).

In some embodiments, the operation method of the image sensor may further include changing, by the row driver, settings for controlling the pixel. For example, the image sensor may communicate with an image processor. The image processor may adjust a waveform of the transfer gate signal that the row driver of the image sensor generates.

In some embodiments, the changing of the settings for controlling the pixel may include changing a middle voltage level (i.e., the second voltage level) of the transfer gate signal. For example, the changing of the setting for controlling the pixel may include allowing the row driver to generate another transfer gate signal having the first voltage level, the third voltage level, or the fourth voltage level, after changing the settings. The fourth voltage level may be the middle voltage level. In more detail, the fourth voltage level may be higher than the first voltage level, may be lower than the third voltage level, and may be different from the second voltage level.

In some embodiments, the operation method of the image sensor may include processing image data depending on the changed settings, after changing the settings. For convenience of description, the reset operation in operation S230 is referred to as a "first reset operation", and an additional reset operation after operation S260 and before changing the settings is referred to as a "second reset operation". The transfer gate signal in operation S220 is referred to as a "first transfer gate signal, and the another transfer gate signal after changing the settings is referred to as a "second transfer gate signal". After the settings are changed, the row driver may generate the second transfer gate signal having the first voltage level, the third voltage level, or the fourth voltage level. The fourth voltage level may be the middle voltage level and may be different from the second voltage level in operation S240.

In this case, the operation method of the image sensor may further include accumulating charges through the photo diode after changing the settings, applying the second transfer gate signal having the first voltage level to the transfer transistor after changing the settings, performing a third reset operation on the floating diffusion node through the reset transistor, changing the first voltage level of the second transfer gate signal to the fourth voltage level after performing the third reset operation, changing the fourth voltage level of the second transfer gate signal to the third voltage level such that the charges accumulated through the photo diode are diffused to the floating diffusion node through the transfer transistor, and changing the third voltage level of the second transfer gate signal to the fourth voltage level.

As another example, the operation method of the image sensor may further include changing the fourth voltage level of the second transfer gate signal to the first voltage level, after the third voltage level of the second transfer gate signal is changed to the fourth voltage level, and performing, by the reset transistor, a fourth reset operation on the floating diffusion node through the reset transistor after the fourth voltage level of the second transfer gate signal is changed to the first voltage level.

Figure 15:
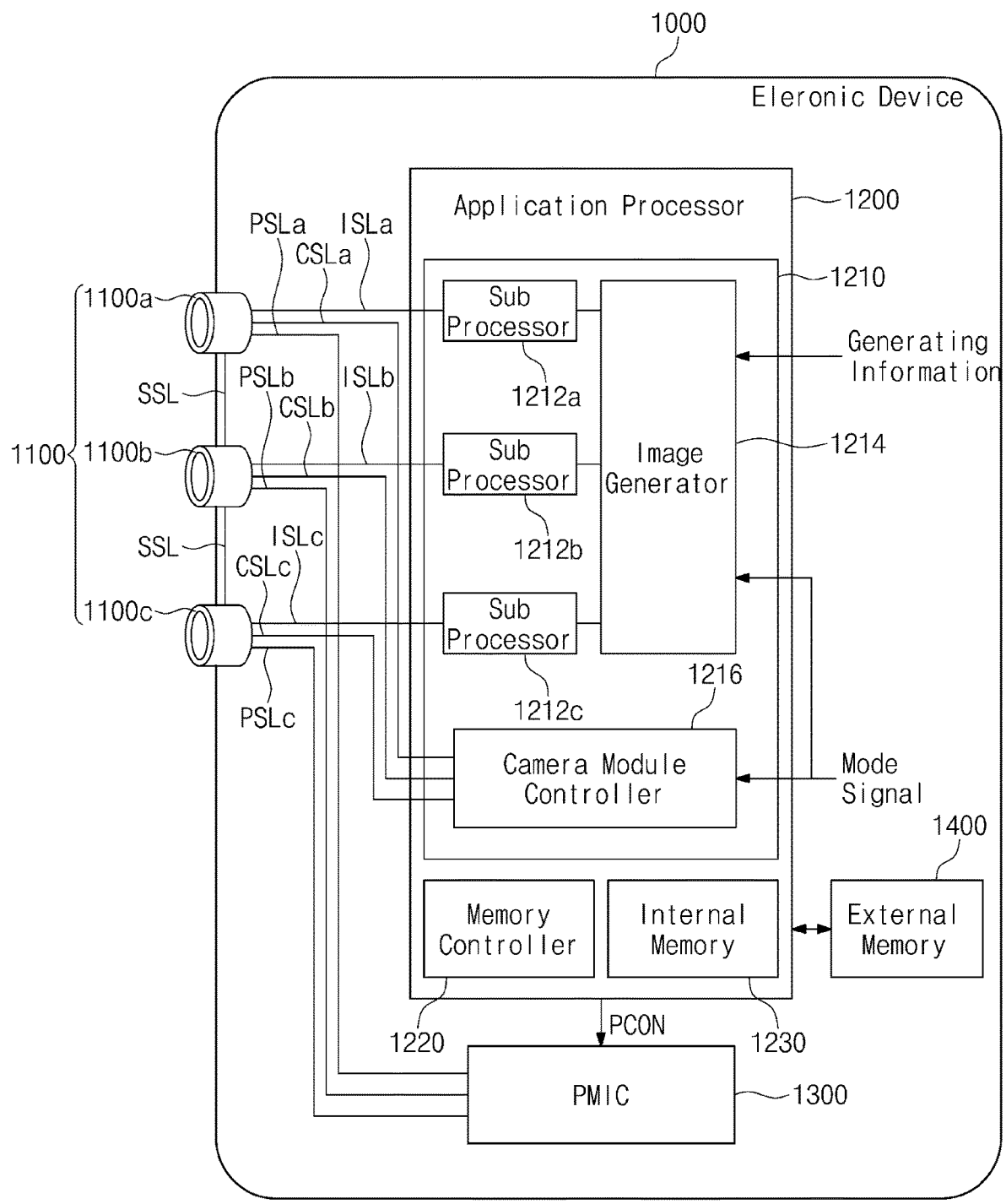
FIG. 15 is a block diagram of an electronic device including a multi-camera module, according to some embodiments.
Figure 16:
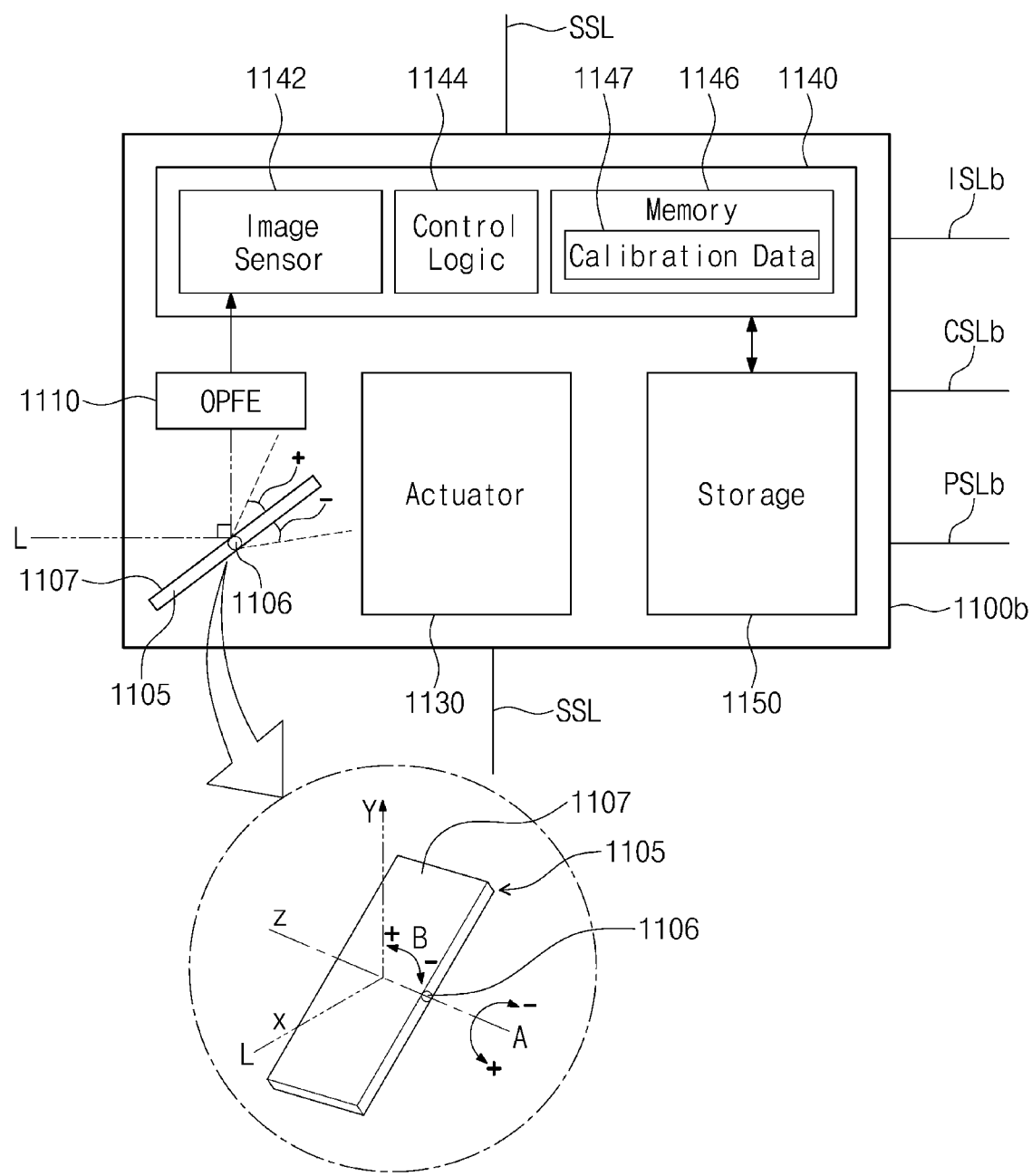
FIG. 16 is a block diagram illustrating a camera module of the electronic device of FIG. 15 in detail, according to some embodiments.

FIG. 15 is a block diagram of an electronic device including a multi-camera module, according to some embodiments. FIG. 16 is a block diagram illustrating a camera module of FIG. 15 in detail, according to some embodiments.

Referring to FIG. 15, an electronic device 1000 may include a camera module group 1100, an application processor 1200, a power management integrated circuit (PMIC) 1300, and an external memory 1400.

The camera module group 1100 may include a plurality of camera modules 1100a, 1100b, and 1100c. An electronic device including three camera modules 1100a, 1100b, and 1100c is illustrated in FIG. 15, but embodiments are not limited thereto. In some embodiments, the camera module group 1100 may be modified to include only two camera modules. Also, in some embodiments, the camera module group 1100 may be modified to include "n" camera modules (n being a natural number of 4 or more).

Each of the plurality of camera modules 1100a, 1100b, and 1100c may include an image sensor according to various embodiments. For example each of the plurality of camera modules 1100a, 1100b, and 1100c may include the image sensor 100 of FIGS. 1 and 2. The image sensor may include the pixel PIX of FIG. 4 or the pixel PIXf of FIG. 11. The image sensor may include a photo diode, a transfer transistor, and a reset transistor. A row driver of the image sensor may control a pixel. The image sensor may perform the operation methods of FIGS. 13 and 14.

Below, a detailed configuration of the camera module 1100b will be more fully described with reference to FIG. 16, but the following description may be equally applied to the remaining camera modules 1100a and 1100c.

Referring to FIG. 16, the camera module 1100b may include a prism 1105, an optical path folding element (OPFE) 1110, an actuator 1130, an image sensing device 1140, and a storage 1150.

The prism 1105 may include a reflecting plane 1107 of a light reflecting material and may change a path of a light "L" incident from the outside.

In some embodiments, the prism 1105 may change a path of the light "L" incident in a X-axis direction to a Y-axis direction perpendicular to the X-axis direction, Also, the prism 1105 may change the path of the light "L" incident in the X-axis direction to the Y-axis direction perpendicular to the X-axis direction by rotating the reflecting plane 1107 of the light reflecting material in direction "A" about a central axis 1106 or rotating the central axis 1106 in direction "B". In this case, the OPFE 1110 may move in a Z-axis direction perpendicular to the X-axis direction and the Y-axis direction.

In some embodiments, as illustrated in FIG. 16, a maximum rotation angle of the prism 1105 in direction "A" may be equal to or smaller than 15 degrees in a positive A direction and may be greater than 15 degrees in a negative A direction, but embodiments are not limited thereto.

In some embodiments, the prism 1105 may move within approximately 20 degrees in a positive or negative B direction, between 10 degrees and 20 degrees, or between 15 degrees and 20 degrees, here, the prism 1105 may move at the same angle in the positive or negative B direction or may move at a similar angle within approximately 1 degree.

In some embodiments, the prism 1105 may move the reflecting plane 1107 of the light reflecting material in the Z-axis direction parallel to a direction in which the central axis 1106 extends.

The OPFE 1110 may include optical lenses composed of "m" groups (m being a natural number), for example. Here, "m" lens may move in the Y-axis direction to change an optical zoom ratio of the camera module 1100b. For example, when a default optical zoom ratio of the camera module 1100b is "Z", the optical zoom ratio of the camera module 1100b may be changed to an optical zoom ratio of 3Z, 5Z, or 5Z or more by moving "m" optical lens included in the OPFE 1110.

The actuator 1130 may move the OPFE 1110 or an optical lens (hereinafter referred to as an "optical lens") to a specific location. For example, the actuator 1130 may adjust a location of an optical lens such that an image sensor 1142 is placed at a focal length of the optical lens for accurate sensing.

The image sensing device 1140 may include the image sensor 1142, control logic 1144, and a memory 1146. The image sensor 1142 may sense an image of a sensing target by using the light "L" provided through an optical lens. The control logic 1144 may control overall operations of the camera module 1100b. For example, the control logic 1144 may control an operation of the camera module 1100b based on a control signal provided through a control signal line CSLb.

The memory 1146 may store information, which is for an operation of the camera module 1100b, such as calibration data 1147. The calibration data 1147 may include information for the camera module 1100b to generate image data by using the light "L" provided from the outside. The calibration data 1147 may include, for example, information about the degree of rotation described above, information about a focal length, information about an optical axis, etc. In the case where the camera module 1100b is implemented in the form of a multi-state camera in which a focal length varies depending on a location of an optical lens, the calibration data 1147 may include a focal length value for each location (or state) of the optical lens and information about auto focusing. In the case where the camera module 1100b is implemented in the form of a multi-state camera whose focal distance varies depending on a location of an optical lens, the calibration data 1147 may include information about a focal distance value and auto focusing for each location (or each stage) of the optical lens.

The storage 1150 may store image data sensed through the image sensor 1142. The storage 1150 may be disposed outside the image sensing device 1140 and may be implemented in a configuration in which the storage 1150 and a sensor chip constituting the image sensing device 1140 are stacked. In some embodiments, the storage 1150 may be implemented with an electrically erasable programmable read only memory (EEPROM), but embodiments are not limited thereto.

Referring together to FIGS. 15 and 16, in some embodiments, each of the plurality of camera modules 1100a, 1100b, and 1100c may include the actuator 1130. As such, the same calibration data 1147 or different calibration data 1147 may be included in the plurality of camera modules 1100a, 1100b, and 1100c depending on operations of the actuators 1130 therein.

In some embodiments, one camera module (e.g., 1100b) among the plurality of camera modules 1100a, 1100b, and 1100c may be a folded lens shape of camera module in which the prism 1105 and the OPFE 1110 described above are included, and the remaining camera modules (e.g., 1100a and 1100c) may be a vertical shape of camera module in which the prism 1105 and the OPFE 1110 described above are omitted, however, embodiments are not limited thereto.

In some embodiments, one camera module (e.g., 1100c) among the plurality of camera modules 1100a, 1100b, and 1100c may be, for example, a vertical shape of depth camera extracting depth information by using an infrared ray (IR).

In this case, the application processor 1200 may merge image data provided from the depth camera and image data provided from any other camera module (e.g., 1100a or 1100b) and may generate a three-dimensional (3D) depth image.

In some embodiments, at least two camera modules (e.g., 1100a and 1100b) among the plurality of camera modules 1100a, 1100b, and 1100c may have different fields of view. In this case, the at least two camera modules (e.g., 1100a and 1100b) among the plurality of camera modules 1100a, 1100b, and 1100c may include different optical lens, but embodiments are not limited thereto.

Also, in some embodiments, fields of view of the plurality of camera modules 1100a, 1100b, and 1100c may be different. In this case, the plurality of camera modules 1100a, 1100b, and 1100c may include different optical lenses, but embodiments are not limited thereto.

In some embodiments, the plurality of camera modules 1100a, 1100b, and 1100c may be disposed to be physically separated from each other. That is, the plurality of camera modules 1100a, 1100b, and 1100c may not use a sensing area of one image sensor 1142, but the plurality of camera modules 1100a, 1100b, and 1100c may include independent image sensors 1142 therein, respectively.

Returning to FIG. 15, the application processor 1200 may include an image processing device 1210, a memory controller 1220, and an internal memory 1230. The application processor 1200 may be implemented to be separated from the plurality of camera modules 1100a, 1100b, and 1100c. For example, the application processor 1200 and the plurality of camera modules 1100a, 1100b, and 1100c may be implemented with separate semiconductor chips.

The image processing device 1210 may include a plurality of sub image processors 1212a, 1212b, and 1212c, an image generator 1214, and a camera module controller 1216.

The image processing device 1210 may include the plurality of sub image processors 1212a, 1212b, and 1212c, the number of which corresponds to the number of the plurality of camera modules 1100a, 1100b, and 1100c.

Image data respectively generated from the camera modules 1100a, 1100b, and 1100c may be respectively provided to the corresponding sub image processors 1212a, 1212b, and 1212c through separated image signal lines ISLa, ISLb, and ISLc. For example, the image data generated from the camera module 1100a may be provided to the sub image processor 1212a through the image signal line ISLa, the image data generated from the camera module 1100b may be provided to the sub image processor 1212b through the image signal line ISLb, and the image data generated from the camera module 1100c may be provided to the sub image processor 1212c through the image signal line ISLc. The image data transmission may be performed, for example, by using a camera serial interface (CSI) based on the Mobile Industry Processor Interface (MIPI), but embodiments are not limited thereto.

In some embodiments, one sub image processor may be disposed to correspond to a plurality of camera modules. For example, the sub image processor 1212a and the sub image processor 1212c may be integrally implemented, not separated from each other as illustrated in FIG. 15. In this case, one of the pieces of image data respectively provided from the camera module 1100a and the camera module 1100c may be selected through a selection element (e.g., a multiplexer), and the selected image data may be provided to the integrated sub image processor.

The image data respectively provided to the sub image processors 1212a, 1212b, and 1212c may be provided to the image generator 1214. The image generator 1214 may generate an output image by using the image data respectively provided from the sub image processors 1212a, 1212b, and 1212c, depending on image generating information (Generating Information) or a mode signal (Mode Signal).

In detail, the image generator 1214 may generate the output image by merging at least a portion of the image data respectively generated from the camera modules 1100a, 1100b, and 1100c having different fields of view, depending on the image generating information Generating Information or the mode signal. Also, the image generator 1214 may generate the output image by selecting one of the image data respectively generated from the camera modules 1100a, 1100b, and 1100c having different fields of view, depending on the image generating information Generating Information or the mode signal.

In some embodiments, the image generating information Generating Information may include a zoom signal or a zoom factor. Also, in some embodiments, the mode signal may be, for example, a signal based on a mode selected from a user.

In the case where the image generating information (Generating Information) is the zoom signal (or zoom factor) and the camera modules 1100a, 1100b, and 1100c have different visual fields of view, the image generator 1214 may perform different operations depending on a kind of the zoom signal. For example, in the case where the zoom signal is a first signal, the image generator 1214 may merge the image data output from the camera module 1100a and the image data output from the camera module 1100c and may generate the output image by using the merged image signal and the image data output from the camera module 1100b that is not used in the merging operation. In the case where the zoom signal is a second signal different from the first signal, without the image data merging operation, the image generator 1214 may select one of the image data respectively output from the camera modules 1100a, 1100b, and 1100c and may output the selected image data as the output image. However, embodiments are not limited thereto, and a way to process image data may be modified without limitation if necessary.

In some embodiments, the image generator 1214 may generate merged image data having an increased dynamic range by receiving a plurality of image data of different exposure times from at least one of the plurality of sub image processors 1212a, 1212b, and 1212c and performing high dynamic range (HDR) processing on the plurality of image data.

The camera module controller 1216 may provide control signals to the camera modules 1100a, 1100b, and 1100c, respectively. The control signals generated from the camera module controller 1216 may be respectively provided to the corresponding camera modules 1100a, 1100b, and 1100c through control signal lines CSLa, CSLb, and CSLc separated from each other.

In some embodiments, one of the plurality of camera modules 1100a, 1100b, and 1100c may be designated as a master camera (e.g., 1100b) depending on the image generating information (Generating Information) including a zoom signal or the mode signal (Mode Signal), and the remaining camera modules (e.g., 1100a and 1100c) may be designated as slave cameras. The above designation information may be included in the control signals, and the control signals including the designation information may be respectively provided to the corresponding camera modules 1100a, 1100b, and 1100c through the control signal lines CSLa, CSLb, and CSLc separated from each other.

Camera modules operating as a master and a slave may be changed depending on the zoom factor or an operating mode signal. For example, in the case where the field of view of the camera module 1100a is wider than the field of view of the camera module 1100b and the zoom factor indicates a low zoom ratio, the camera module 1100b may operate as a master, and the camera module 1100a may operate as a slave. In contrast, in the case where the zoom factor indicates a high zoom ratio, the camera module 1100a may operate as a master, and the camera module 1100b may operate as a slave.

In some embodiments, the control signal provided from the camera module controller 1216 to each of the camera modules 1100a, 1100b, and 1100c may include a sync enable signal. For example, in the case where the camera module 1100b is used as a master camera and the camera modules 1100a and 1100c are used as a slave camera, the camera module controller 1216 may transmit the sync enable signal to the camera module 1100b. The camera module 1100b that is provided with sync enable signal may generate a sync signal based on the provided sync enable signal and may provide the generated sync signal to the camera modules 1100a and 1100c through a sync signal line SSL. The camera module 1100b and the camera modules 1100a and 1100c may be synchronized with the sync signal to transmit image data to the application processor 1200.

In some embodiments, the control signal provided from the camera module controller 1216 to each of the camera modules 1100a, 1100b, and 1100c may include mode information according to the mode signal (Mode Signal). Based on the mode information, the plurality of camera modules 1100a, 1100b, and 1100c may operate in a first operating mode and a second operating mode with regard to a sensing speed.

In the first operating mode, the plurality of camera modules 1100a, 1100b, and 1100c may generate image signals at a first speed (e.g., may generate image signals of a first frame rate), may encode the image signals at a second speed (e.g., may encode the image signal of a second frame rate higher than the first frame rate), and transmit the encoded image signals to the application processor 1200. In this case, the second speed may be 30 times or less the first speed.

The application processor 1200 may store the received image signals, that is, the encoded image signals in the internal memory 1230 provided therein or the external memory 1400 placed outside the application processor 1200. Afterwards, the application processor 1200 may read and decode the encoded image signals from the internal memory 1230 or the external memory 1400 and may display image data generated based on the decoded image signals. For example, the corresponding one among sub image processors 1212a, 1212b, and 1212c of the image processing device 1210 may perform decoding and may also perform image processing on the decoded image signal.

In the second operating mode, the plurality of camera modules 1100a, 1100b, and 1100c may generate image signals at a third speed (e.g., may generate image signals of a third frame rate lower than the first frame rate) and transmit the image signals to the application processor 1200. The image signals provided to the application processor 1200 may be signals that are not encoded. The application processor 1200 may perform image processing on the received image signals or may store the image signals in the internal memory 1230 or the external memory 1400.

The PMIC 1300 may supply power, for example, power supply voltages to the plurality of camera modules 1100a, 1100b, and 1100c, respectively. For example, under control of the application processor 1200, the PMIC 1300 may supply a first power to the camera module 1100a through a power signal line PSLa, may supply a second power to the camera module 1100b through a power signal line PSLb, and may supply a third power to the camera module 1100c through a power signal line PSLc.

In response to a power control signal PCON from the application processor 1200, the PMIC 1300 may generate a power corresponding to each of the plurality of camera modules 1100a, 1100b, and 1100c and may adjust a level of the power. The power control signal PCON may include a power adjustment signal for each operating mode of the plurality of camera modules 1100a, 1100b, and 1100c. For example, the operating mode may include a low-power mode. In this case, the power control signal PCON may include information about a camera module operating in the low-power mode and a set power level. Levels of the powers respectively provided to the plurality of camera modules 1100a, 1100b, and 1100c may be identical to each other or may be different from each other. Also, a level of a power may be dynamically changed.

According to an embodiment of the present disclosure, an image sensor using a transfer gate signal having three voltage levels, and a method of operating the same are provided.

Also, an image sensor generating image data of high quality by suppressing a negative effect due to a defect while a photo diode accumulates charges and suppressing a negative effect due to a leakage during a readout period, and a method of operating the same are provided.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A method of operating an image sensor which includes a pixel including a photo diode, a transfer transistor, and a reset transistor, and a row driver controlling the pixel, the method comprising:
   accumulating first charges, through the photo diode;
   applying a first transfer gate signal having a first voltage level to the transfer transistor;
   performing, through the reset transistor, a first reset operation on a floating diffusion node connected with the reset transistor and the transfer transistor;
   changing the first voltage level of the first transfer gate signal to a second voltage level higher than the first voltage level, during the first reset operation;
   changing the second voltage level of the first transfer gate signal to a third voltage level higher than the second voltage level such that the first charges accumulated through the photo diode are diffused to the floating diffusion node through the transfer transistor; and
   changing the third voltage level of the first transfer gate signal to the second voltage level.

2. The method of claim 1, further comprising:
   performing, through the reset transistor, a second reset operation on the floating diffusion node, after the third voltage level of the first transfer gate signal is changed to the second voltage level; and changing the second voltage level of the first transfer gate signal to the first voltage level, during the second reset operation.

3. The method of claim 2, wherein a first time period from a time at which the first voltage level of the first transfer gate signal is changed to the second voltage level to a time at which the first reset operation is completed is equal to a second time period from a time at which the second reset operation starts to a time at which the second voltage level of the first transfer gate signal is changed to the first voltage level.

4. The method of claim 1, wherein, when the first voltage level of the first transfer gate signal is changed to the second voltage level, a leakage current of the floating diffusion node decreases.

5. The method of claim 1, wherein the first voltage level is lower than a voltage level of a ground voltage.

6. The method of claim 1, further comprising:
changing, by the row driver, settings for controlling the pixel.

7. The method of claim 6, wherein the changing, by the row driver, the settings for controlling the pixel includes:
after the settings are changed, allowing the row driver to generate a second transfer gate signal having the first voltage level, the third voltage level, or a fourth voltage level, and
wherein the fourth voltage level is higher than the first voltage level, is lower than the third voltage level, and is different from the second voltage level.

8. The method of claim 7, further comprising, after the settings are changed:
accumulating second charges through the photo diode;
applying the second transfer gate signal having the first voltage level to the transfer transistor;
performing, through the reset transistor, a third reset operation on the floating diffusion node;
changing the first voltage level of the second transfer gate signal to the fourth voltage level, during the third reset operation;
changing the fourth voltage level of the second transfer gate signal to the third voltage level such that the second charges accumulated through the photo diode are diffused to the floating diffusion node through the transfer transistor; and
changing the third voltage level of the second transfer gate signal to the fourth voltage level.

9. The method of claim 8, further comprising:
performing, through the reset transistor, a fourth reset operation on the floating diffusion node, after the third voltage level of the second transfer gate signal is changed to the fourth voltage level; and
changing the fourth voltage level of the second transfer gate signal to the first voltage level, during the fourth reset operation.

10. The method of claim 7, wherein the changing, by the row driver, the settings for controlling the pixel includes:
after changing the settings, determining a time period in which the second transfer gate signal is maintained at the third voltage level.

11. A method of operating an image sensor which includes a pixel including a photo diode, a transfer transistor, and a reset transistor, and a row driver controlling the pixel, the method comprising:
accumulating first charges, through the photo diode;
applying a first transfer gate signal having a first voltage level to the transfer transistor;

performing, through the reset transistor, a first reset operation on a floating diffusion node connected with the reset transistor and the transfer transistor;
changing the first voltage level of the first transfer gate signal to a second voltage level higher than the first voltage level after performing the first reset operation;
changing the second voltage level of the first transfer gate signal to a third voltage level higher than the second voltage level such that the first charges accumulated through the photo diode are diffused to the floating diffusion node through the transfer transistor; and
changing the third voltage level of the first transfer gate signal to the second voltage level.

12. The method of claim 11, further comprising:
changing the second voltage level of the first transfer gate signal to the first voltage level, after the third voltage level of the first transfer gate signal is changed to the second voltage level; and
performing a second reset operation on the floating diffusion node through the reset transistor, after the second voltage level of the first transfer gate signal is changed to the first voltage level.

13. The method of claim 12, wherein a first time period from a time at which the first reset operation is completed to a time at which the first voltage level of the first transfer gate signal is changed to the second voltage level is equal to a second time period from a time at which the second voltage level of the first transfer gate signal is changed to the first voltage level to a time at which the second reset operation starts.

14. The method of claim 11, further comprising:
changing, by the row driver, settings for controlling the pixel,
wherein the changing, by the row driver, the settings for controlling the pixel includes:
after the settings are changed, allowing the row driver to generate a second transfer gate signal having the first voltage level, the third voltage level, or a fourth voltage level, and
wherein the fourth voltage level is higher than the first voltage level, is lower than the third voltage level, and is different from the second voltage level.

15. The method of claim 14, further comprising, after the settings are changed:
accumulating second charges through the photo diode;
applying the second transfer gate signal having the first voltage level to the transfer transistor;
performing, through the reset transistor, a third reset operation on the floating diffusion node;
after performing the third reset operation, changing the first voltage level of the second transfer gate signal to the fourth voltage level;
changing the fourth voltage level of the second transfer gate signal to the third voltage level such that the second charges accumulated through the photo diode are diffused to the floating diffusion node through the transfer transistor; and
changing the third voltage level of the second transfer gate signal to the fourth voltage level.

16. The method of claim 15, further comprising:
changing the fourth voltage level of the second transfer gate signal to the first voltage level, after the third voltage level of the second transfer gate signal is changed to the fourth voltage level; and
performing a fourth reset operation on the floating diffusion node through the reset transistor, after the fourth voltage level of the second transfer gate signal is changed to the first voltage level.

* * * * *